(12) United States Patent
Sommer

(10) Patent No.: US 9,646,710 B2
(45) Date of Patent: May 9, 2017

(54) SEMICONDUCTOR DEVICE WITH CHANNEL SWITCHING STRUCTURE AND METHOD OF MAKING SAME

(75) Inventor: Michael Sommer, Raubling (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/558,287

(22) Filed: Jul. 25, 2012

(65) Prior Publication Data

US 2012/0286334 A1  Nov. 15, 2012

Related U.S. Application Data

(63) Continuation of application No. 12/143,577, filed on Jun. 20, 2008, now Pat. No. 8,320,153.

(51) Int. Cl.
*G11C 17/00* (2006.01)
*G11C 17/10* (2006.01)
*H01L 27/112* (2006.01)

(52) U.S. Cl.
CPC ............ *G11C 17/10* (2013.01); *H01L 27/112* (2013.01); *H01L 27/11226* (2013.01); *Y10T 29/49002* (2015.01)

(58) Field of Classification Search
CPC . G11C 17/10; H01L 27/11226; H01L 27/112; Y10T 29/49002

USPC .................................... 365/94, 96, 103, 104
See application file for complete search history.

(56) References Cited

U.S. PATENT DOCUMENTS

| | | | |
|---|---|---|---|
| 4,255,210 A | 3/1981 | Okuyama et al. | |
| 4,294,001 A | 10/1981 | Kuo | |
| 5,329,143 A * | 7/1994 | Chan | H01L 27/0259 257/173 |
| 5,517,061 A | 5/1996 | Azmanov | |
| 5,644,312 A | 7/1997 | Deevy et al. | |
| 2007/0057894 A1* | 3/2007 | Natori | G09G 3/3611 345/98 |
| 2007/0076462 A1* | 4/2007 | Richter et al. | 365/94 |
| 2007/0121379 A1* | 5/2007 | Kuramori | G11C 16/28 365/185.14 |

FOREIGN PATENT DOCUMENTS

| | | |
|---|---|---|
| DE | 29 09 996 A1 | 9/1979 |
| FR | 2796195 | 1/2001 |
| WO | WO 96/17438 | 6/1996 |

* cited by examiner

*Primary Examiner* — Tha-O H Bui
(74) *Attorney, Agent, or Firm* — Slater Matsil, LLP

(57) ABSTRACT

Embodiments relate to a semiconductor device, including a channel area; a gate line extending along the channel area so that the channel area can be set into a conductive state by activating the gate line; a plurality of terminals including an electrical connection to the channel area, so that the plurality of terminals is connectable to a predetermined voltage by activating the gate line.

19 Claims, 21 Drawing Sheets

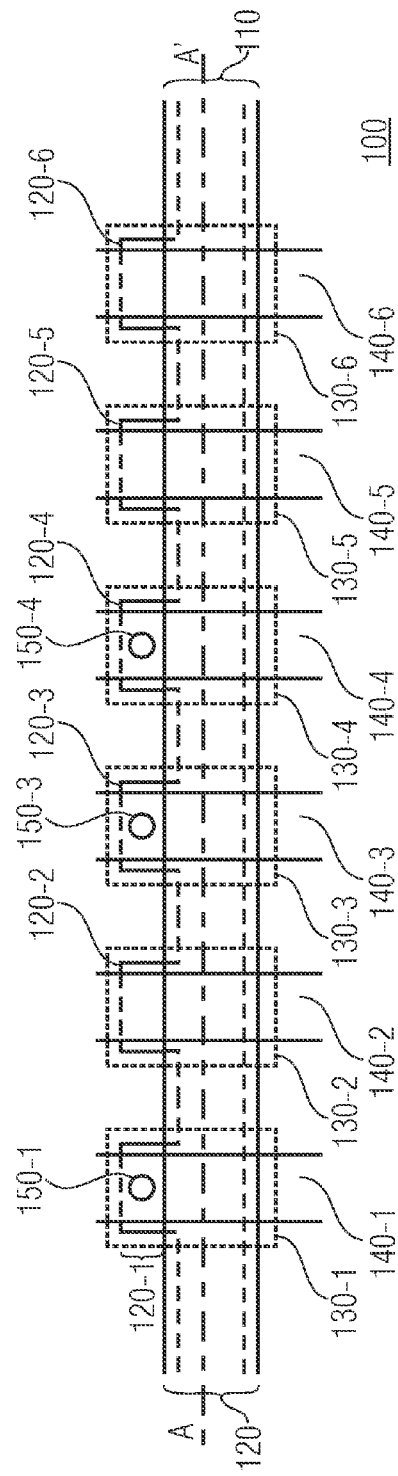
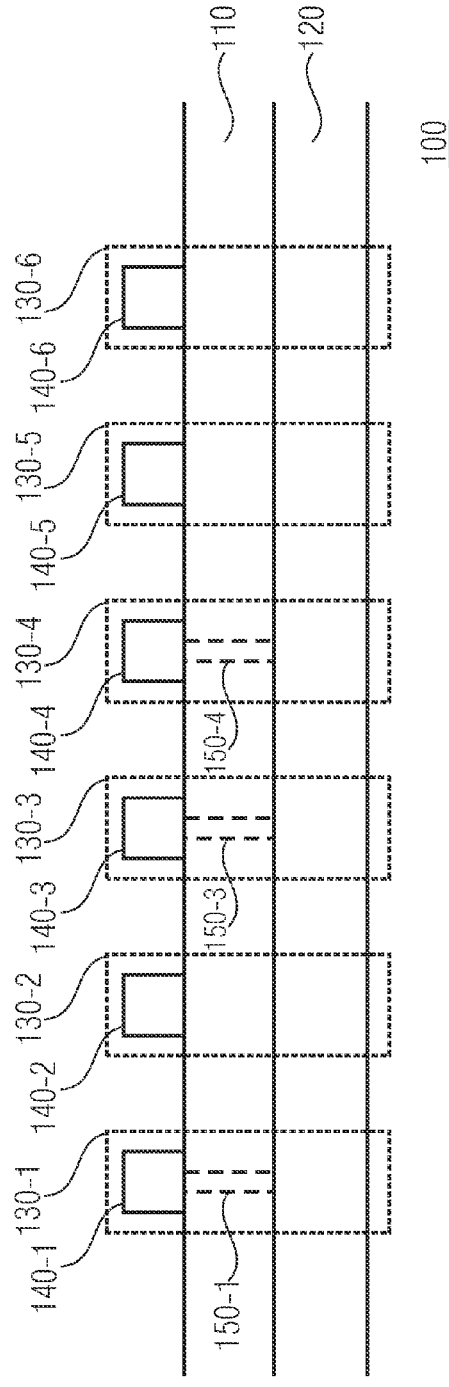
FIG 1A
FIG 1B

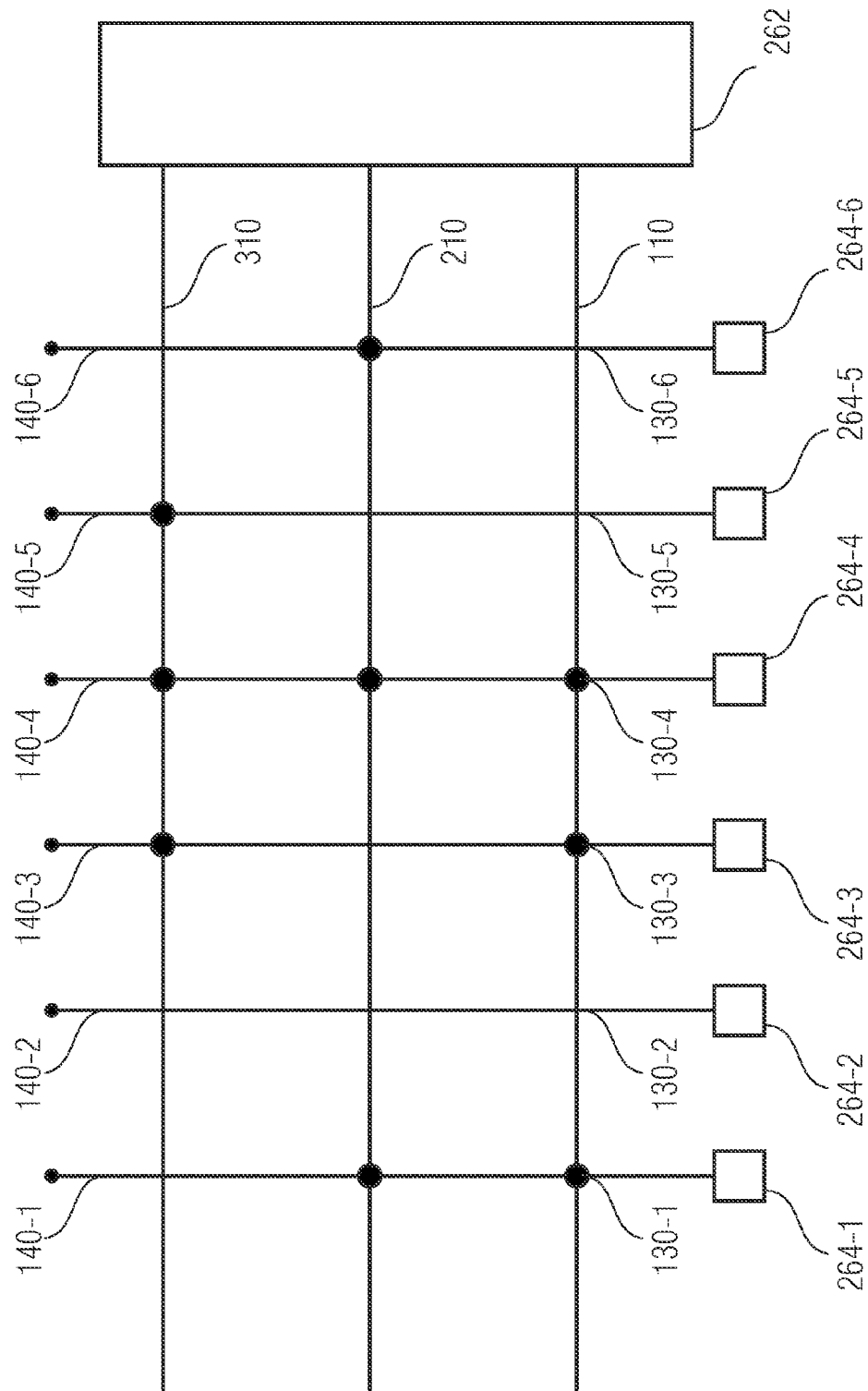

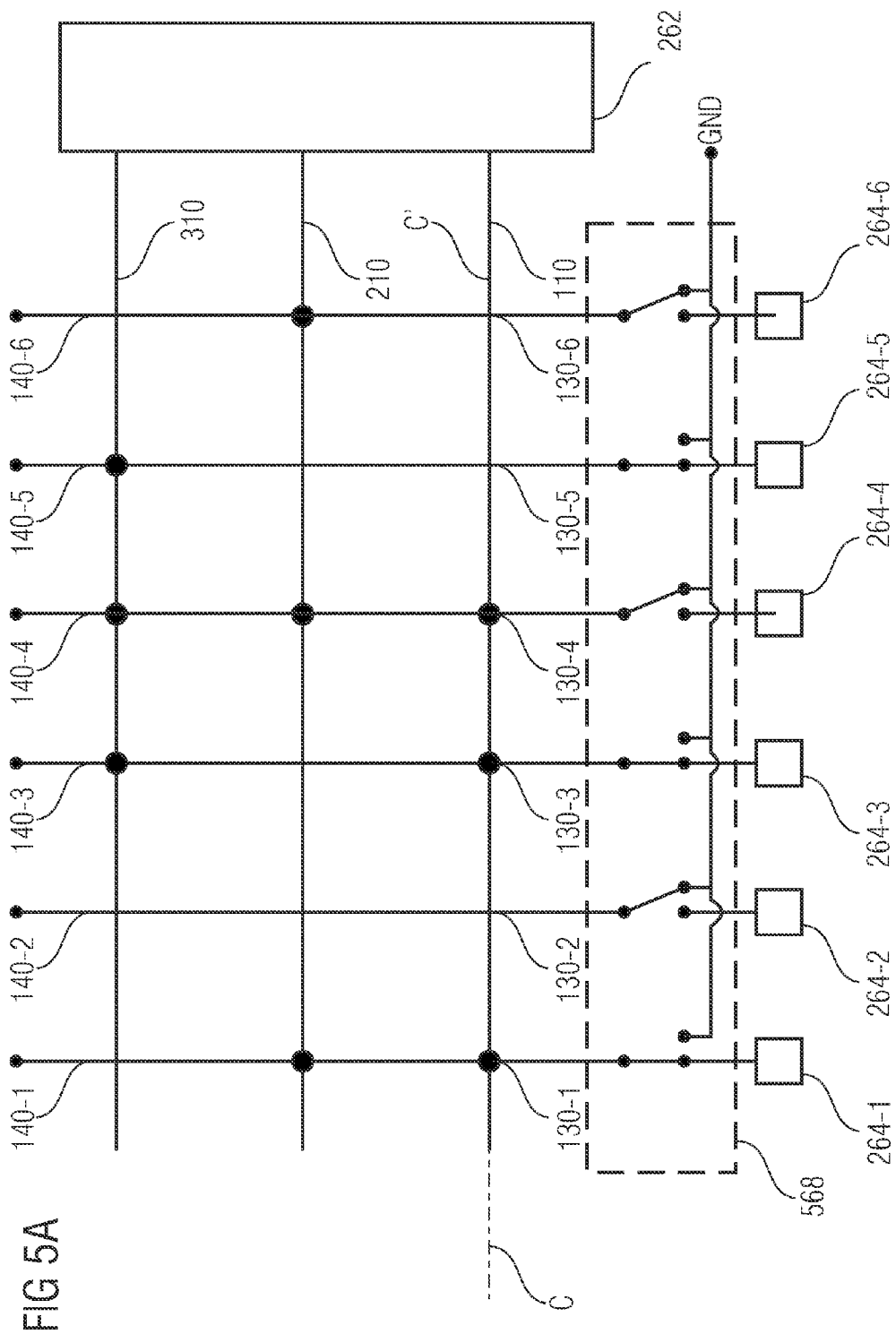

SEMICONDUCTOR DEVICE WITH CHANNEL SWITCHING STRUCTURE AND METHOD OF MAKING SAME

This application is a continuation of U.S. application Ser. No. 12/143,577, which was filed on Jun. 20, 2008 entitled, "Semiconductor Device and Method for Making Same" and is incorporated herein by reference.

TECHNICAL FIELD

Embodiments of the present invention relate to semiconductor devices and methods of making semiconductor devices.

BACKGROUND

Read-only memories (ROM) are memories typically used for storing data permanently and are non-volatile. Typical implementations of read-only memories comprise a grid of word lines (WL) for selecting a specific information stored in the read-only memory, and bit lines (BL) or columns (Col) for the data output, i.e., for reading out the specific information from the read-only memory. The crossing points of the word lines and the bit lines within the grid define the positions of bit cells storing the information.

Known read-only memory architectures are, for example, based on using additional selection transistors. In such architectures, a bit is not associated with a single transistor but, for example, with an eighth of a transistor. Additionally, the signal path is lead over eight conductive transistors. This leads to relatively large resistance values in the signal path. Furthermore, the transistors have to be contacted from the drain terminal and the source terminal in known read-only memories.

SUMMARY OF THE INVENTION

Embodiments of the invention provide a semiconductor device, comprising: a channel area; a gate line extending along the channel area, so that the channel area can be put into a conductive state by activating the gate line; a plurality of terminals comprising an electrical connection to the channel area, so that the plurality of terminals is connectable to a predetermined voltage by activating the gate line. In one or more embodiments, the semiconductor device may be a switching device.

Embodiments of the invention relate to a semiconductor device, comprising: a channel area; a gate line extending along the channel area, so that the channel area can be set into a conductive state by activating the gate line; and at least three terminals electrically coupled to the channel area, the at least three terminals being electrically coupled together by activating the gate line. In one or more embodiments, the semiconductor device may be a switching structure.

Embodiments of the invention provide a read-only memory, comprising: a channel area, a gate line extending along the channel area so that the channel area can be set into a conductive state by activating the gate line; a plurality of storage cells arranged along the channel area, each storage cell having associated therewith a read line, wherein a storage cell storing a first value comprises an electrical connection between the associated read line and the channel area; and wherein a storage cell storing a second value does not comprise an electrical connection between the associated read line and the channel area, so that a read line associated with a storage cell storing a first value is connectable to a predetermined voltage by activating the gate line.

Embodiments of the invention enable designing a surface area optimized and economic ROM-architecture and at the same time improving the performance of the ROM-architecture. Embodiments of the read-only memory comprise unchangeable or unmodifiable information, which can be read or processed in a fast manner.

BRIEF DESCRIPTION OF THE DRAWINGS

Embodiments are described herein after, making reference to the appended drawings.

FIG. 1A shows a top-view of an embodiment of a read-only memory;

FIG. 1B shows a cross-section A-A' of an embodiment according to FIG. 1A;

FIG. 2C shows a schematic diagram of an embodiment of a read-only memory according to FIG. 2B for an n-type channel area;

FIG. 5A shows a schematic diagram of an embodiment of a read-only memory comprising a selection unit, to connect a read line to a predetermined voltage independent of a gate line activation;

Figure 1C:
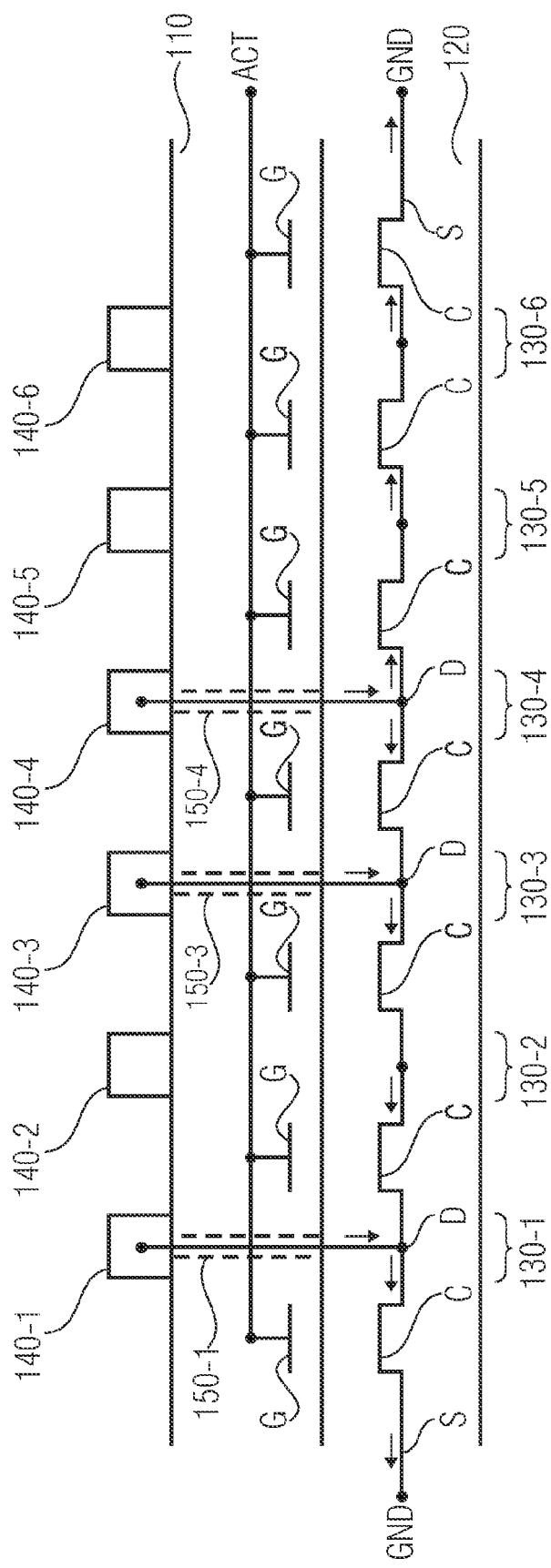
FIG. 1C shows the cross-section A-A' of FIG. 1B and additionally the graphic symbols of the electrical elements of the embodiments.

Equal or equivalent elements or elements with equal or equivalent functionality are denoted in the following description of the figures by equal or equivalent reference numerals.

DETAILED DESCRIPTION OF ILLUSTRATIVE EMBODIMENTS

FIG. 1A shows a top-view of an embodiment of a read-only memory comprising a gate line 110 (see continuous lines), a channel area 120 (see dashed lines), a plurality of storage cells 130-1 to 130-6 (see dotted lines), a plurality of read lines 140-1 to 140-6 (see continuous lines) and electrical connections 150-1, 150-3 and 150-4.

In FIG. 1B the cross-section A-A' of FIG. 1A is shown. The gate line 110, the channel area 120 and the plurality of read lines 140-1 to 140-6 are shown in continuous lines and the electrical connections 150-1, 150-3 and 150-4 are shown in dashed lines (for illustrative purposes as they are not arranged at the plane of the cross-section defined by A-A').

As shown in FIGS. 1A and 1B the gate line 110 is arranged above the channel area 120, and the read lines 140-1 to 140-6 are arranged above the gate line 110. The read lines 140-1 to 140-6 are electrically insulated from a gate line 110, for example, by an insulation layer arranged between the read lines and a gate line (not shown in FIG. 1B). The position of each storage cell 130-1 to 130-6 is defined by the cross point of the word line 110 and the respective, i.e., associated, read line 140-1 to 140-6. In other words, the storage cells 130-1 to 130-6 are arranged along the channel area 120 respective of the gate line 110 corresponding to the channel area 120, and each storage cell 130-1 to 130-6 has associated therewith a corresponding read line 140-1 to 140-6. Each storage cell 130-1 to 130-6 is adapted to store a value, which can be readout via the respective read line, for example, the value stored by the storage cell 130-1 can be readout via the read line 140-1. Embodiments of the read-only memory comprise storage cells of a first storage cell type and a second storage cell type. Embodiments of the first storage cell type, e.g., storage cells 130-1, 130-3 and 130-4, comprise each an electrical connection, e.g., 150-1, 150-3, 150-4, and store a first value. Embodiments of the second storage cell type, e.g., storage cells 130-2, 130-5 and 130-6, do each not comprise an electrical connection and store a second value.

The gate line 110 extends along the channel area 120 so that the channel area can be set into a conductive state by activating the gate line and into a non-conductive state by deactivating the gate line.

An embodiment of a read-only memory, as shown in FIGS. 1A and 1B, is arranged such that a read line 140-1, 140-3, 140-4 associated with a storage cell 130-1, 130-3, 130-4 storing a first value is connectable to a predetermined voltage by activating the gate line and, thus, setting the channel area 120 into a conductive state.

FIG. 1C shows the cross-section of FIG. 1B and additionally the graphic symbols of the transistor structure realized by the embodiments, in particular, the gate structure G formed by the gate line 110, the channel C formed by the channel area 120 and the electrical connection between the read lines 140-1, 140-3, 140-4 and the channel C formed by the electrical connections 150-1, 150-3 and 150-4.

In addition, FIG. 1C shows an embodiment of a read-only memory with an n-type channel area 120, which is connected to ground GND at both ends of the channel area 120 (left and right hand side of FIG. 1C). The arrows show the current flow when the gate line 110 is activated by an activate signal ACT and thus, the channel area 120 respectively C controlled by the gate line 110 is in a conductive state. For n-type channel areas the activate signal can be, for example, implemented as a high voltage level signal "H", and the corresponding deactivate signal DEACT, for example, as low voltage level signal "L".

A higher voltage than ground GND, for example, a supply voltage or charge current is applied to read lines 140-1 to 140-6. When the gate line 110 is activated, the channel area 120 becomes conductive and the voltage of the bit lines 140-1, 140-3, 140-4 associated with bit cells 130-1, 130-3, 130-4 comprising an electrical connection 150-1, 150-3, 150-4 is pulled down to ground GND or at least to a low voltage level L below a certain threshold value, whereas the voltage of the bit lines 140-2, 140-5, 140-6 associated with the bit cell 130-2, 130-5, 130-6, which do not comprise an electrical connection, keep or maintain the voltage level of, for example, the supply voltage or at least a high voltage level H above a further threshold. The high and low voltage levels for defining the ACT/DEACT signal and the ones for reading the stored data can be set to different values.

Although FIG. 1C shows individual gate/channel structures (G and C) or transistor structures between the read lines 140-1 to 140-6 and the ground connection of the channel area 120, the gate line 110 and the channel area 120 form one continuous gate/channel structure, or in other words, one large transistor, which comprises a plurality of connections or terminals 150-1, 150-3, 150-4. Therefore, this structure can also be referred to as a multi-terminal transistor and the embodiment with an n-type channel area also as multi-terminal n-channel transistor.

With regard to typical field-effect transistor structures, the gate line 110 can be regarded as a single common gate G, the channel area 120 as a single common channel C, the connection of the channel area 120, e.g., at its ends, to ground as common source S or common source contact S (see FIG. 1C) and the connections 150-1, 150-3, 150-4 of the storage cells of the first storage cell type and the respective read lines as drain contacts D or drain terminals D (see FIG. 1C).

In further embodiments the common source contacts S for connecting the channel area 120 to the predetermined voltage can be implemented similar to the drain contacts D for the storage cells of the first storage cell type. In other words the common source contacts S can comprise, for example, a protrusion and a vertical electrical connection to a connecting line arranged, for example, in the same layer as the read lines.

Embodiments of the read-only memory 100 may comprise a gate line 110 and a channel area 120, which are arranged such that they form any suitable field-effect transistor (FET) or FET-like structure, for example, a junction-FET (JFET) or a metal oxide semiconductor FET (MOSFET) structure. In embodiments using a MOSFET-like structure, the gate line 110 and the channel area 120 are separated by an insulating layer, for example, an oxide layer (not shown in FIGS. 1B and 1C).

The channel area 120 may comprise any suitable semiconductor material, for example silicon.

Although FIG. 1C shows an embodiment comprising an n-type channel area 120, alternative embodiments may comprise a p-type channel area 120. It is known to a person skilled in the art, that voltages and currents for p-type channel embodiments have reverse signs.

The gate line 110 may comprise metals or highly conductive polycrystalline semiconductor material, for example, poly-silicon, doped such that the required switching characteristics for switching the channel area 120 between the conductive state and the non-conductive state, are achieved.

Although FIG. 1A shows an embodiment of a channel area 120 comprising a main body and lateral protrusions 120-1 to 120-6 for each storage cell 130-1 to 130-6, the protrusions extending beyond a lateral dimension of the gate line 110 (for protrusion 120-1) to provide the connection between the associated read line and the channel area via a vertical electrical connection 150-1, 150-3, 150-4, other embodiments of the read-only memory may comprise other means for electrically connecting the associated read line with the channel area 120. In other embodiments, for example, the channel area 120 can be implemented to comprise no protrusions and the electrical connection 150-1 can be implemented through the gate line 110 and electrically insulated therefrom by an insulating layer surrounding the electrical connection. In other embodiments, the channel area 120 may comprise only protrusions for storage cells comprising an electrical connection, for example, the protrusions 120-2, 120-5 and 120-6 would not be present or produced.

In further embodiments, the channel area 120 and the gate line 110 can be implemented into or onto a substrate. Although FIGS. 1A to 1C show an embodiment of a read-only memory, where the gate line 110 is arranged on top or above the channel area 120, and the read lines 140-1 to 140-6 are arranged on top or above the gate line 110, other orders of these structures or layers defined by the read lines 140-1 to 140-6, the gate line 110 and the channel area 120 are possible. However, embodiments, wherein the gate line 110 and the electrical connection (terminal) of the channel area 120 are arranged at the same side of the channel area 120 can provide lower on-resistances (in conductive state) because the concentration of the charge carriers is higher at the side, where the gate line 110 is arranged.

Although FIG. 1A shows an embodiment, where the channel area 120 is narrower than the gate line 110, i.e., does not extend beyond the lateral dimension of the gate line 110 except for the protrusions 120-1 to 120-6, other embodiments can comprise channel areas 120, which extend at one or both sides beyond the lateral dimensions of the gate line 110. However, parts of the channel area 120 which extend beyond the lateral dimension of the gate line 110 will comprise a lower charge carrier concentration than parts of the channel area 120, which are arranged below the gate line 110. Therefore, embodiments, similar as the one shown in FIG. 1A, provide a low on-resistance during the conducting state over the whole width of the channel area 120.

Furthermore, although FIG. 1C shows an embodiment, where the contacts for connecting the channel area 120 to a predetermined voltage, for example ground GND, are arranged at the opposite ends of the channel area 120, other embodiments of the channel area may comprise only one or more than two of such contacts and at any position of the channel area. However, it should be noted that the shorter the distance between an electrical connection 150-1, 150-3, 150-4 and the nearest such contact is, the lower the on-resistance value and the faster the information stored in the storage cells can be accessed or read.

Figure 2A:
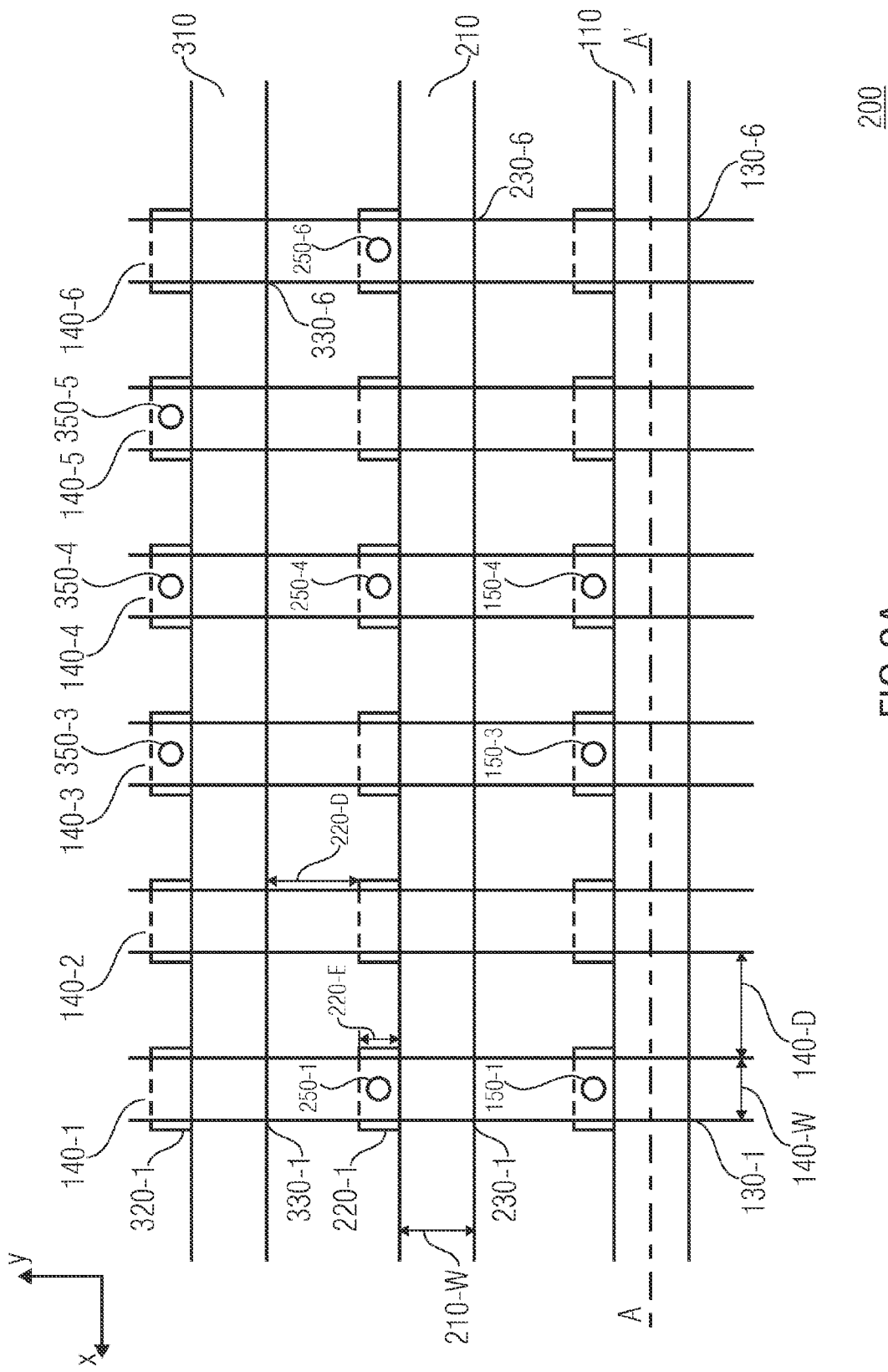
FIG. 2A shows a top-view of an embodiment of a read-only memory with a plurality of gate lines.

FIG. 2A shows a top-view of another embodiment of a read-only memory 200 comprising three gate lines 110, 210 and 310, six read lines 140-1 to 140-6 and 18 storage cells 130-1 to 130-6, 230-1 to 230-6 and 330-1 to 330-6 (wherein only some of these storage cells and their respective reference signs are shown to not overload FIG. 2A). The channel areas 120, 220 and 320 are, except for their respective protrusions 120-1 to 120-6, 220-1 to 220-6, 320-1 to 320-6, not shown in FIG. 2A to not overload the drawing. The same reference numbering scheme as used for FIGS. 1A to 1C is used. The structure comprising the storage cells 130-1 to 130-6 arranged along the first channel area 120 and along the corresponding first gate line 110 correspond to the embodiment shown in FIGS. 1A to 1C. The storage cells 230-1 to 230-6 arranged along the second channel area 220 and the respective second gate line 210, and the storage cells 330-1 to 330-6 arranged along the third channel area 320 and the corresponding third gate line 310 comprise the same structure as shown in FIGS. 1A to 1C except for the position of the electrical connections 250-1, 250-4, 250-6 and 350-3, 350-4 and 350-5, or in other words, the differ with regard to the storage cell types associated with the read lines 140-1 to 140-6.

The gate lines 110, 210 and 310 and the read lines 140-1 to 140-6 form a storage matrix, wherein each crosspoint of the gate lines and read lines define a position of a storage cell.

The packaging density is defined as the number of storage cells per surface area. As can be seen from FIG. 2A the packaging density in the y-direction depends on the width of the gate lines, exemplarily shown as 210-W for the second gate line 210, the width of the channel area below the gate line, the extension of the protrusion with regard to the lateral dimension of the gate line, shown exemplarily for the protrusion 220-1 as 220-E and the distance between the protrusion of one channel area with regard to a gate line of a neighboring channel area, exemplarily shown as 220-D between the protrusion of the second channel area 220 and the third gate line 310. With regard to the packaging density in the x-direction, the packaging density depends on the width of the read lines, exemplarily shown as 140-W and the distance between two neighboring read lines, exemplarily shown as 140-D.

The smaller these dimensions can be implemented, the higher is the packaging density.

Figure 2B:
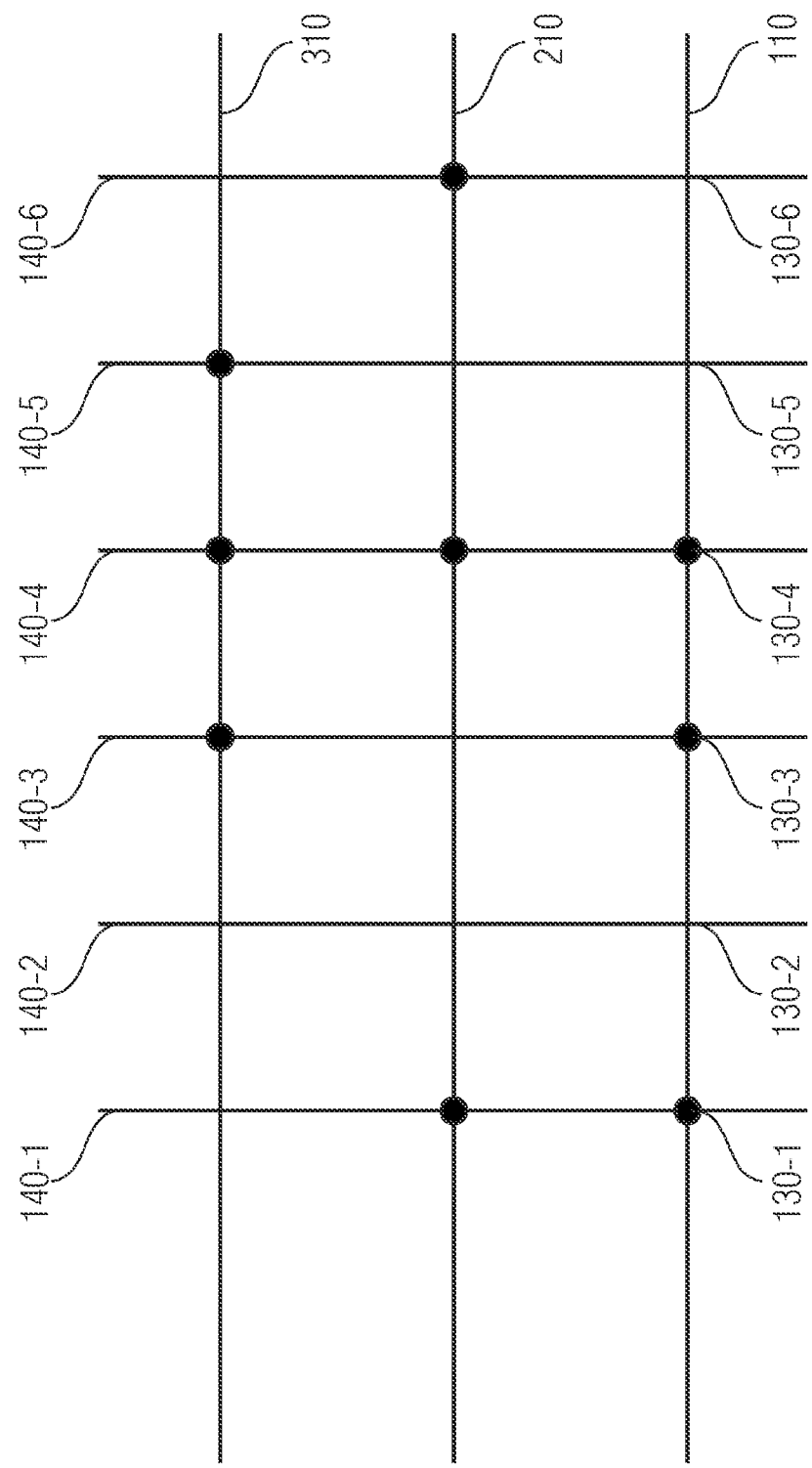
FIG. 2B shows a schematic diagram of an embodiment of a read-only memory according to FIG. 2A.

FIG. 2B shows a schematic diagram of a read-only memory according to FIG. 2A. FIG. 2B shows only the first gate line 110, the second gate line 210 and the third gate line 310, the six read lines 140-1 to 140-6 and the storage cell type of the individual storage cells. Therein represents a filled circle or "dot" at the crossing point of a gate line and a read line a storage cell of a first storage cell type, i.e., a storage cell comprising a connection between the associated read line and the channel area. The channel areas extend along the respective gate lines and are not shown in the schematic diagram of FIG. 2B.

For selecting or activating a specific word line of the three word lines and for reading or accessing an information stored in the respective storage cells known means and methods can be used.

FIG. 2C shows an embodiment of a read-only memory analog to FIG. 2B (with regard to the cell-types), which comprises n-type channel areas (not shown), a gate line decoder 262 for activating a gate line 110, 210 or 310, wherein the read lines 140-1 to 140-6 are connected at one end to a sense amplifier 264-1 to 264-6. The sense amplifiers 264-1 to 264-6 are, for example, inverting sense amplifiers to implement the wired-OR combination by a wired-AND combination of the inverted signals.

The sense amplifiers can be arranged to charge the read lines 140-1 to 140-6 by a read current and to afterwards read out the information stored in the storage cells. Read lines with a storage cell of a first storage cell type are not charged as the charge current is led away via the conductive channel area (in case the gate line is activated), and thus show a low voltage level L. On the other hand, read lines with a storage cell of a second storage cell type are charged as the charge current is not led away via the conductive channel area (in case the gate line is activated), and thus show a "charged" or high voltage level H.

In further embodiments, the charging of the read lines can be performed by other charging means, e.g., a so called "bleeders" providing a small charging current. In even further embodiments the other end of the read lines 140-1 to 140-6 can be connected to a supply voltage, e.g., $V_{DD}$ or smaller voltages derived therefrom. However, to achieve reliable voltage levels (and to avoid undefined voltage levels between H and L) when reading out the information stored in the storage cells, the supply voltage or charging current is set such that they are large or applied long enough to pull or charge the voltage level of the respective read line to a high level H (in case of a storage cell of a second storage cell type) and at the same time set such that they are small enough or not applied continuously to allow the conductive channel area to pull down the voltage level to a low level L (in case for a storage cell of a first storage cell-type).

Figure 3A:
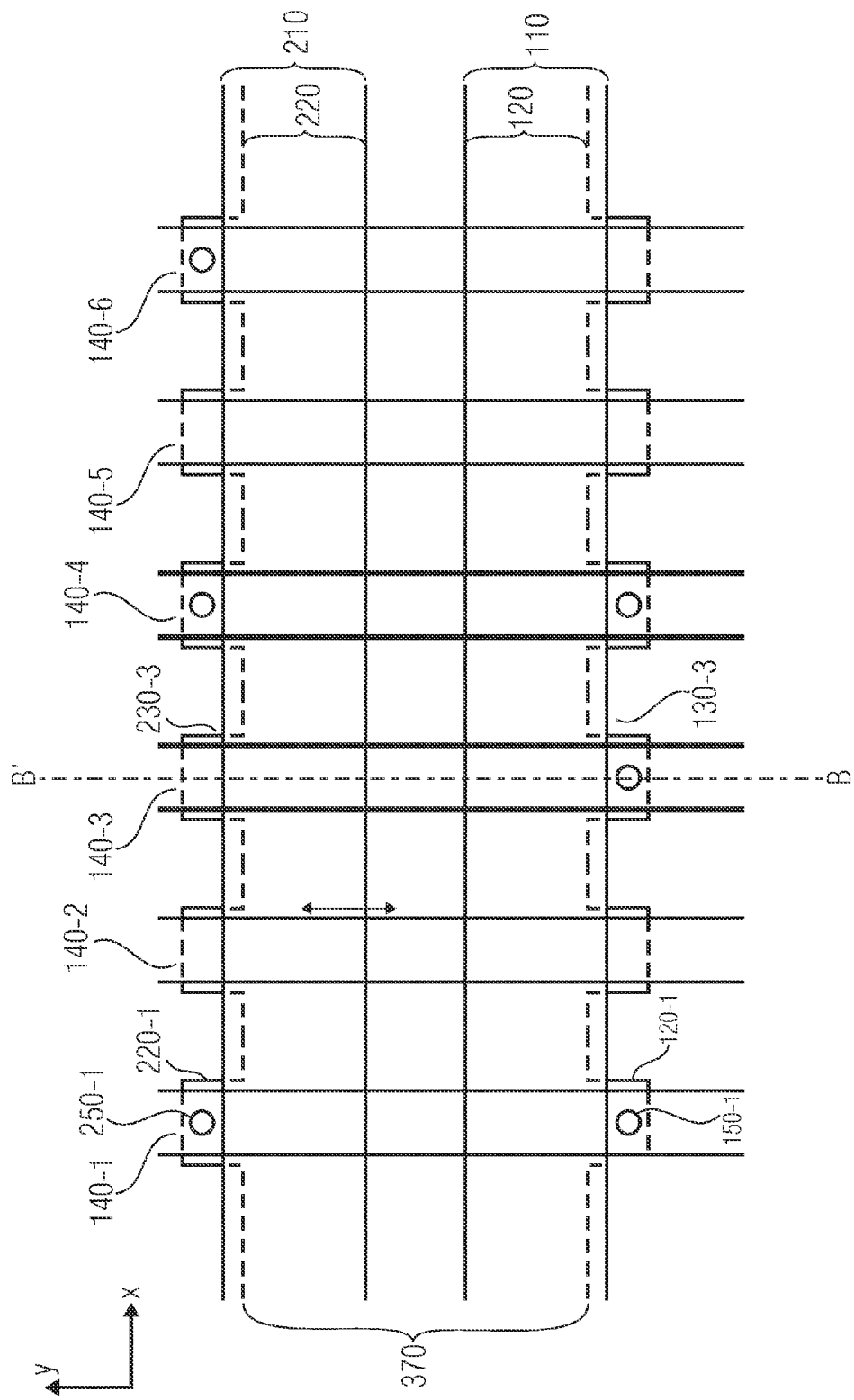
FIG. 3A shows a top-view of a further embodiment of a read-only memory comprising a plurality of gate lines, wherein two neighboring gate lines extend along a common channel structure.

FIG. 3A shows another embodiment of a read-only memory with two gate lines 110, 210 and a common channel structure 370 (see dashed lines).

Figure 3B:
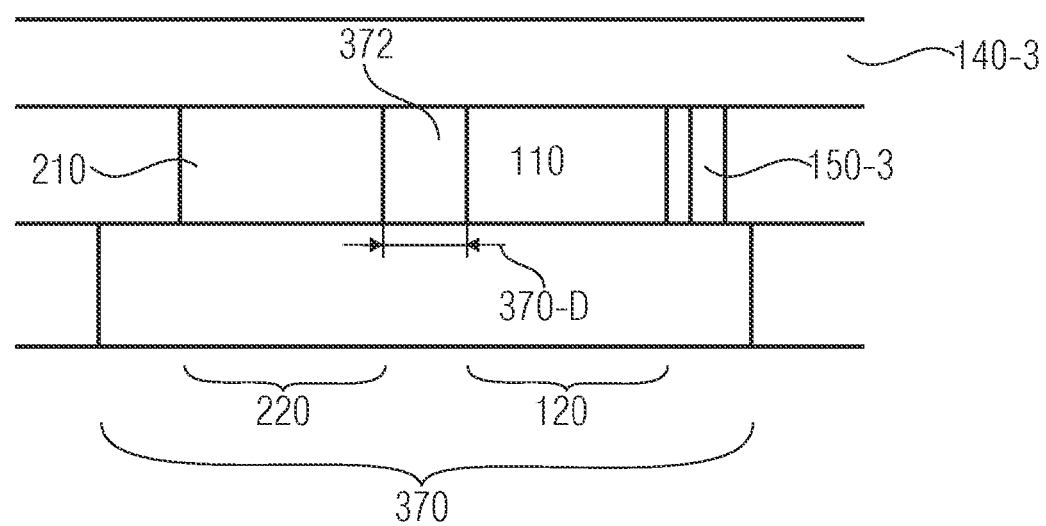
FIG. 3B shows a cross-section B-B' of an embodiment according to FIG. 3A.

FIG. 3B shows a cross-section B-B' of FIG. 3A. FIG. 3B shows the common channel structure 370 comprising the first channel area 120 and the second channel area 220, the first gate line 110 and the second gate line 210, both arranged above the common channel structure 370 and the first gate line 110 extending in x-direction along the first channel area 120 and the second gate line 210 in x-direction along the second channel area 220. Furthermore, the first channel area 120 is connected via the electrical connection 150-3 of the storage cell 130-3 to the associated read line 140-3 extending in the y-direction. The first and the second gate line 110, 210 are separated by an insulating structure 372.

The distance 370-D between the first and the second gate line 110, 210 sharing the common channel structure 370 can be smaller than the distance between two neighboring gate lines of embodiments according to FIG. 2A. Thus, based on the embodiments according to FIGS. 3A and 3B a higher packaging density can be achieved. The minimum distance 370-D is similar to NAND-architectures.

Figure 4A:
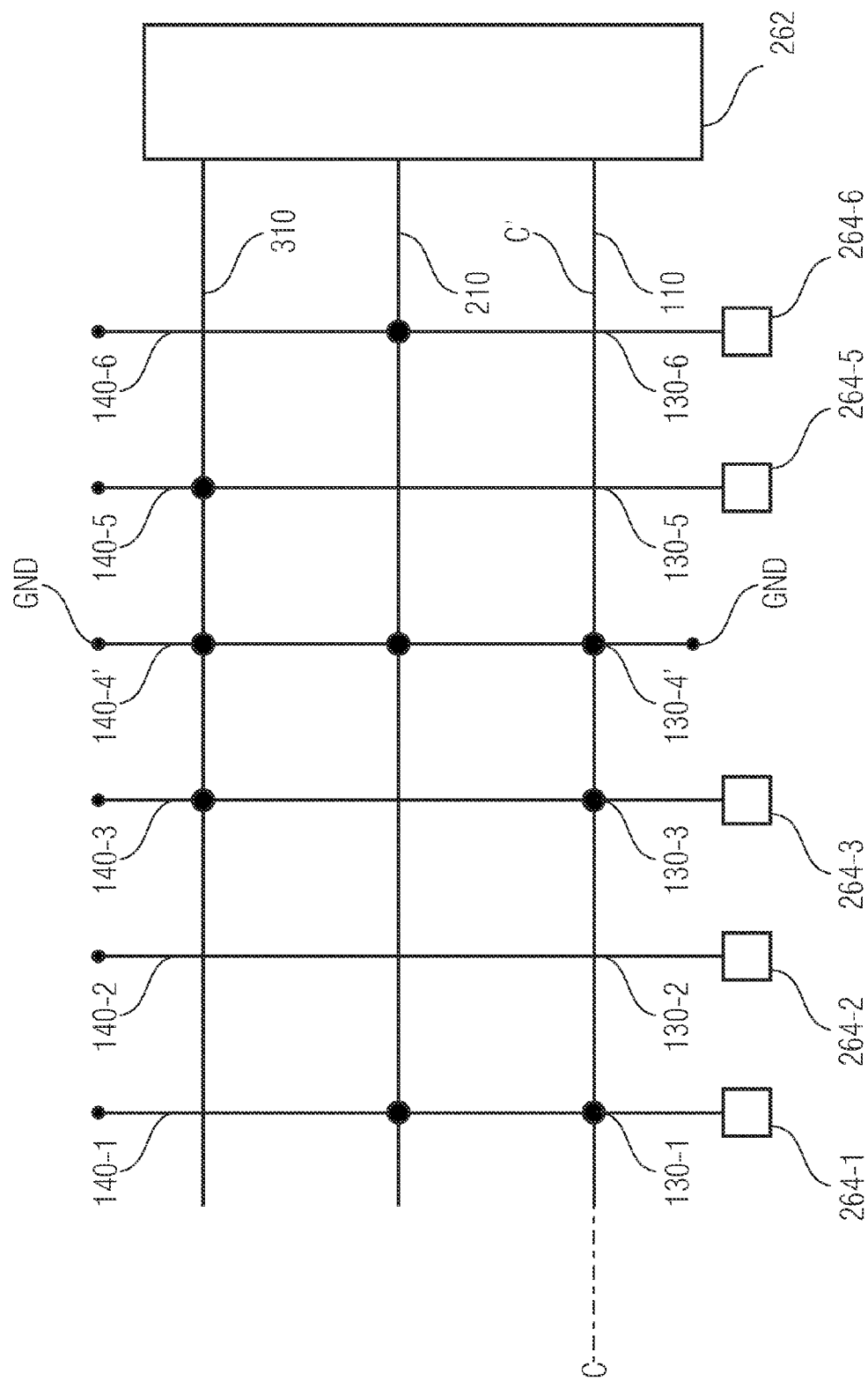
FIG. 4A shows a schematic diagram of an embodiment of a read-only memory comprising a connecting line or dummy read line.

FIG. 4A shows a further embodiment of a read-only memory, where the read line 140-4 has been replaced by a connecting line 140-4' or a dummy-read line 140-4'.

FIG. 4A shows an embodiment of a read-only memory, wherein a connecting cell 130-4' is arranged at a first channel area 120 (not shown in FIG. 4A) extending along the gate line 110, wherein the connecting line 140-4' comprises an electrical connection to the channel area 120, and wherein the connecting line 140-4' is connectable to a predetermined voltage, for example, ground GND, independent of whether the first gate line 110 is activated and the first channel area 120 is conductive. As can be seen from FIG. 4A the connecting line 140-4' can, for example, be connected at one or both ends to the predetermined voltage, e.g., ground GND, whereas the read lines 140-1 to 140-3 and 140-5 and 140-6 are connected to the supply voltage $V_{DD}$ at one end and to the sense amplifier 264-1 to 264-3 and 264-5 and 264-6 at the other end.

The structure or design of the connecting cell 130-4' may be equal to a storage cell of the first storage cell type, e.g., 130-4.

Figure 4B:
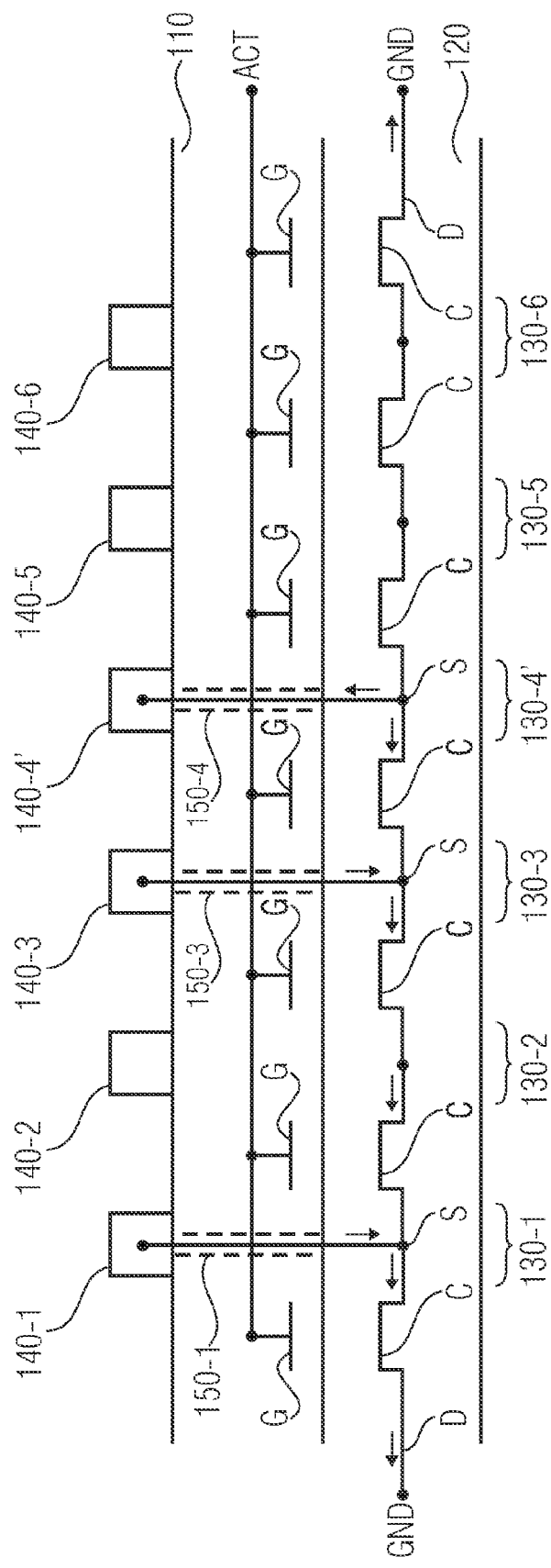
FIG. 4B shows a cross-section C-C' of FIG. 4A and additionally the graphic symbols of the electrical elements of the embodiments.

FIG. 4B shows a cross-section C-C' of FIG. 4A (without the gate line decoder 262), which is with regard to the structure the same as the structure in FIGS. 1A and 1C. However, compared to the current flow of FIG. 1C, the current coming from bit line 140-3 is also directed to the connecting line 140-4' (see arrows of FIG. 4B) because the connecting line 140-4' is connected to ground GND. The path from bit line 140-3 respectively storage cell 130-3 towards ground GND can be shorter via the connecting line 140-4' compared to the current path through the channel area 120 (in particular for embodiments with large words or long word lines). Thus connecting line 140-4' enables a performance improvement, e.g., a faster access or read times.

FIG. 5A shows a read-only memory similar to the read-only memory described based on FIG. 2C. However, the embodiment of the read-only memory shown in FIG. 5A comprises a selection unit 568. The selection unit 568 is implemented to connect the read lines 140-1 to 140-6 to a sense amplifier 264-1 to 264-6 or to a predetermined voltage, for example, ground GND.

FIG. 5A shows an embodiment where every second line 140-2, 140-4 and 140-6 is connected to the predetermined voltage, for example, GND. In further implementations, the read lines 140-1, 140-3, 140-5 belonging to a first set of read lines are read lines for odd addresses, whereas the read lines 140-2, 140-4 and 140-6 belong to a second set of read lines, for example, read lines associated with even addresses. When addressing or accessing the information stored in odd addresses, i.e., reading the values of the read lines 140-1, 140-3, 140-5 belonging to the first set of read lines, the read lines 140-2, 140-4 and 140-6 belonging to the second set of read lines act as additional connections to the predetermined voltage, for example, ground. The effect is similar to the embodiments described based on FIGS. 4A and 4B comprising fixed connection cells and connection lines connecting storage cells with the predetermined voltage, for example, ground. Thus the switching unit adds the possibility to connect some read lines to ground and, thus, enables a performance improvement, e.g., faster access or read times.

Although FIG. 5A shows an embodiment of a read-only memory where every second read line is connected to the predetermined voltage, in further embodiments, only every third, fourth, etc. is connected to ground, whereas the other read lines are connected to the sense amplifier 264-1 to 264-6.

In the following, further embodiments will be described where the storage cells are implemented as bit cells, the first and second storage cells correspond to first and second bit cells, the gate lines are implemented as word lines and the read lines are implemented as bit lines and the channel area is also referred to as active area.

Figure 6:
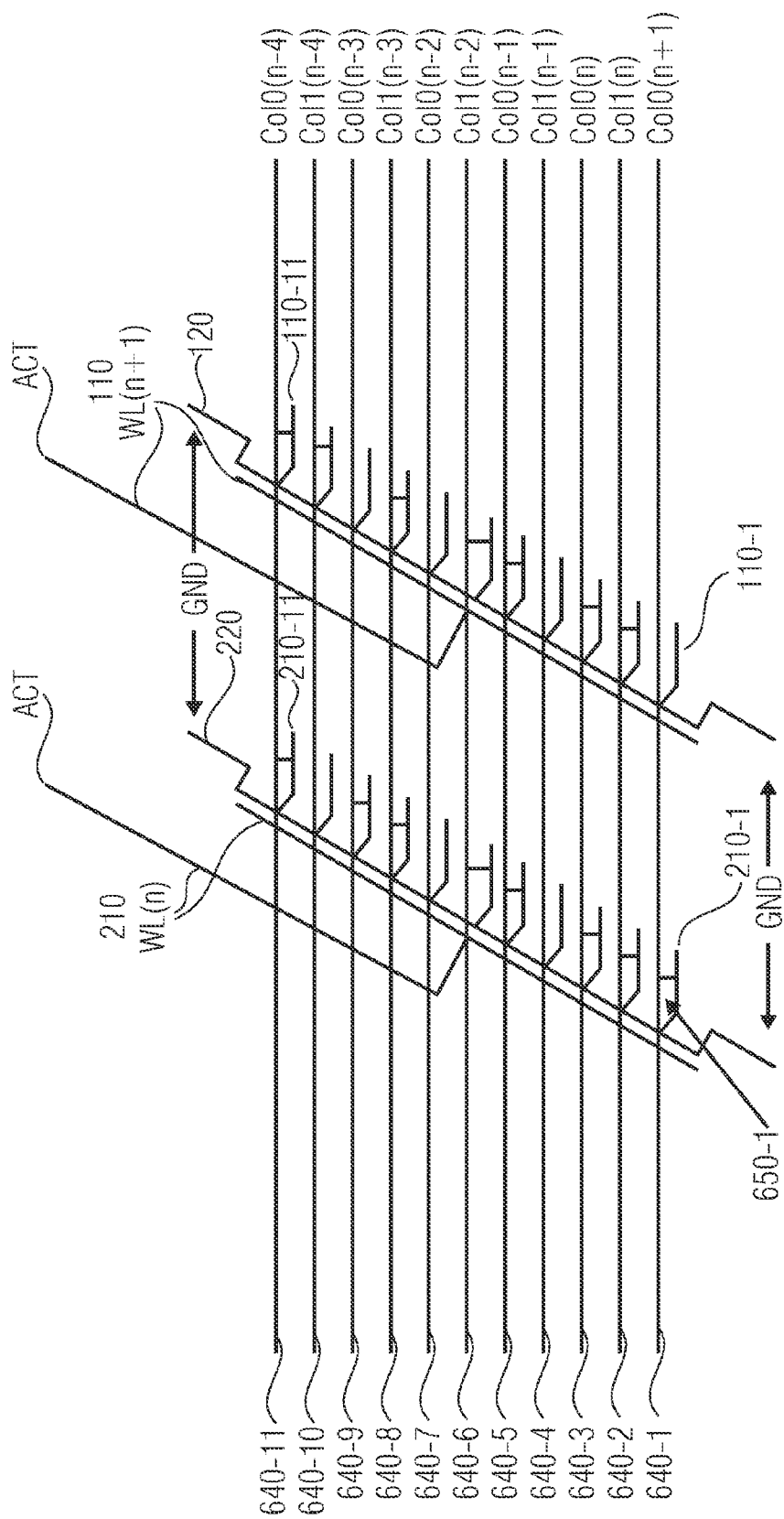
FIG. 6 shows a schematic diagram on the circuit level of another embodiment of a read-only memory.

FIG. 6 shows a schematic diagram on the circuit level of an embodiment of a read-only memory comprising a first channel area 120 and a word line 110, in FIG. 6 also referenced as WL(n+1), which extends along the first channel area 120, a second channel area 220 and a second word line 210, in FIG. 6 also referenced as WL(n), which extends along the second channel area 220. The first channel area 120 and the second channel area 220 are n-type channel areas. The embodiments of the read only memory further comprises eleven bit lines 640-1 to 640-11. The bit lines are also referred to as columns "Col". The bit lines 640-1, 640-3, 640-5, 640-7, 640-9, 640-11 belong to a first set of bit lines, for example, represent bit lines of an odd address represented by the index "zero" after "Col" and the respective running index thereafter (starting from n+1 to n−4). The bit lines 640-2, 640-4, 640-6, 640-8, 640-10 belong to a second set of bit lines, for example, to even addresses as indicated by the index "1" after "Col" and the respective running index (starting from n to n−4).

Exemplarily for the other bit cells reference numbers have been assigned to the bit cells 210-1 and 110-1 to which the first bit line 640-1 is associated with and to 210-11 and 110-11 to which the eleventh bit line is associated with.

As can be seen from FIG. 6, the bit cell 110-1 has no electrical connection between the associated bit line 640-1 and the channel area 120; i.e., the bit cell 110-1 is of a second bit cell type. The bit cell 210-1 comprises an electrical connection 650-1 between the associated bit line 640-1 and the channel area 220, i.e., the bit cell 210-1 is of a first bit cell-type.

The bit cells of a first bit cell type comprising the electrical connection or contact are also referred to as programmed bit cells. The bit cells of the second bit cell type, which do not comprise the electrical connection or contact or, in other words, bit cells where a contact is missing, are also referred to as bit cells where the contact has not been programmed.

The first channel area 120, the wire line 110 and the bit cells 110-1 to 110-11 with their electrical connections (in case they are programmed) form one "giant" multi-terminal, single-channel NFET. In other words, they form one huge NFET, which creates a switchable ground channel connection.

Figure 7:
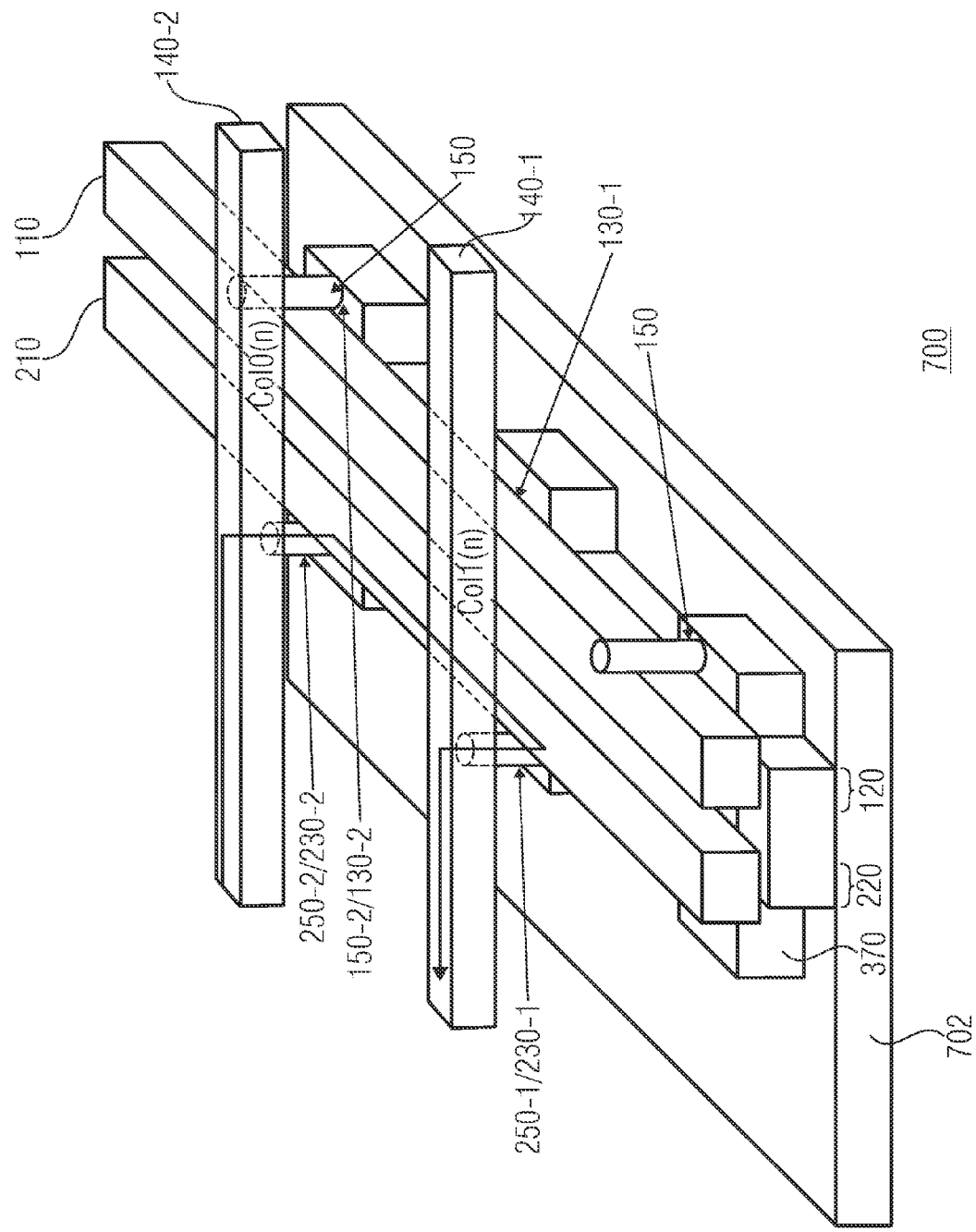
FIG. 7 shows a perspective view of an embodiment of a read only memory comprising two gate lines and a common channel structure.

FIG. 7 shows a three-dimensional or perspective view of an embodiment of a read-only memory 700. The embodiment of the read-only memory 700 comprises a common channel structure 370 (similar to the embodiment shown in FIGS. 3A and 3B) with a first channel area 120 and a second channel area 220, a first wire line 110 arranged along the first channel area 120 and a second wire line 210 extending along the second channel area 220, a first bit line 140-1, in FIG. 7 also referred to as "Col1(n)" and a second bit line or column 140-2, in FIG. 7 also referred to as "Col0(n)". As can be further seen from FIG. 7, with regard to the first bit line 140-1, only the left-hand side of the common channel structure 370 comprises a contact to the bit line 140-1, i.e., is programmed. In other words, the bit cell 230-1 is of a first bit cell type, whereas the bit cell 130-1 is of a second bit cell type. With regard to the second bit line 140-2, both sides of the common channel structure 370 comprise an electrical connection with the bit line 140-2, i.e., both sides are programmed. In other words, the bit cell 230-1 comprises an electrical connection 250-1 connecting the second channel area 220 with the bit line 140-2 and the bit cell 130-2 comprises an electrical connection 150-2 connecting the first channel area 120 with the bit line 140-2.

FIG. 7 shows two multi-terminal single-channel NFETs with a common channel structure, wherein the end of the channel areas 120, 220 are connected to ground.

As can be seen from FIG. 7, the first bit line 140-1 belongs to a first set of bit lines, whereas the second bit line 140-2 belongs to a second set or group of bit lines (Col-0). As can be seen from the arrow starting in the second bit line 140-2 going through the electrical connection 250-2, the second channel area 220, the electrical connection 250-1 and through the first bit line 140-1 (embodiments as described based on FIGS. 5A and 5B), Col-0 carries data and Col-1 is set to ground to provide a short connection to ground and vice-versa (see embodiments as described based on FIGS. 5A and 5B).

FIGS. 8A to 8D show the intermediate and final structure of a method of producing an embodiment of a read-only memory. In order to not overburden the drawings, the insulating layers and areas between the channel areas, the bit lines and the electrical connections are not shown.

Figure 8A:
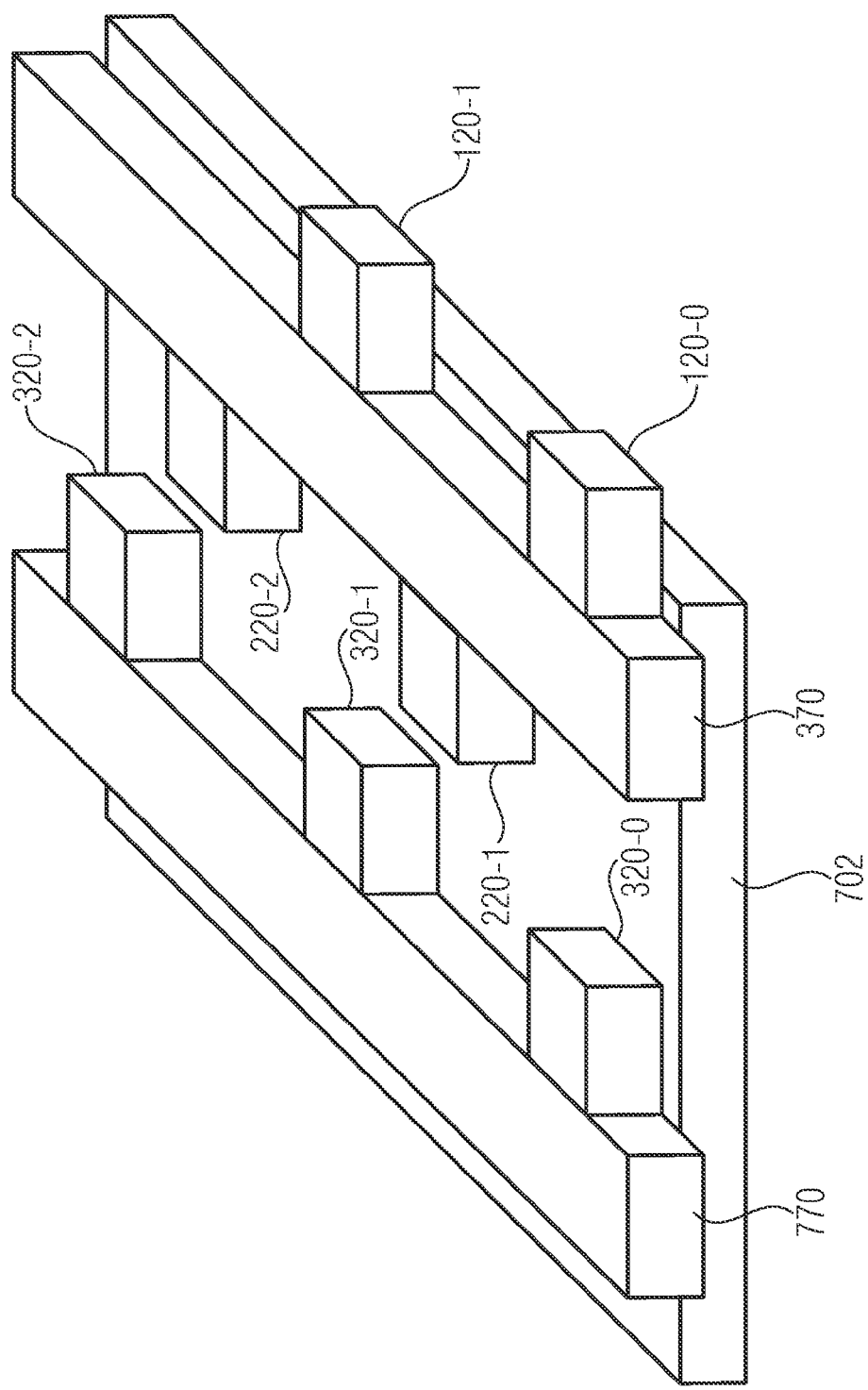
FIGS. 8A to 8D show intermediate and final read-only memory structures of a manufacturing process for manufacturing an embodiment of a read-only memory.

FIG. 8A shows a substrate 702 and two common channel structures 370 and 770, which are both arranged on the substrate 702. The structure of the second multi-terminal NFET on the right hand side (comprising the second common channel structure 770) is only shown partly, e.g., only the protrusions on the left hand side and the left hand side word line).

The first common channel structure 370 comprises on the right-hand side a protrusion 120-0 and protrusion 120-1. The common channel structure 370 comprises on the left-hand side protrusions 220-1 and 220-2. The protrusions 120-0, 120-1 have the same distance to each other as the protrusions 220-1 and 220-2 on the right-hand side and the protrusions on the right-hand side 120-0, 120-1 are shifted with regard to the protrusions 220-1, 220-2 on the left-hand side by half of their distance.

The channel structure 770 comprises protrusions 320-0, 320-1 and 320-2 on the right hand side. The distance between the protrusions 320-0 to 320-1 and the distance between the protrusion 320-1 and 320-2 is the same as for the protrusions 120-0, 120-1.

Figure 8B:
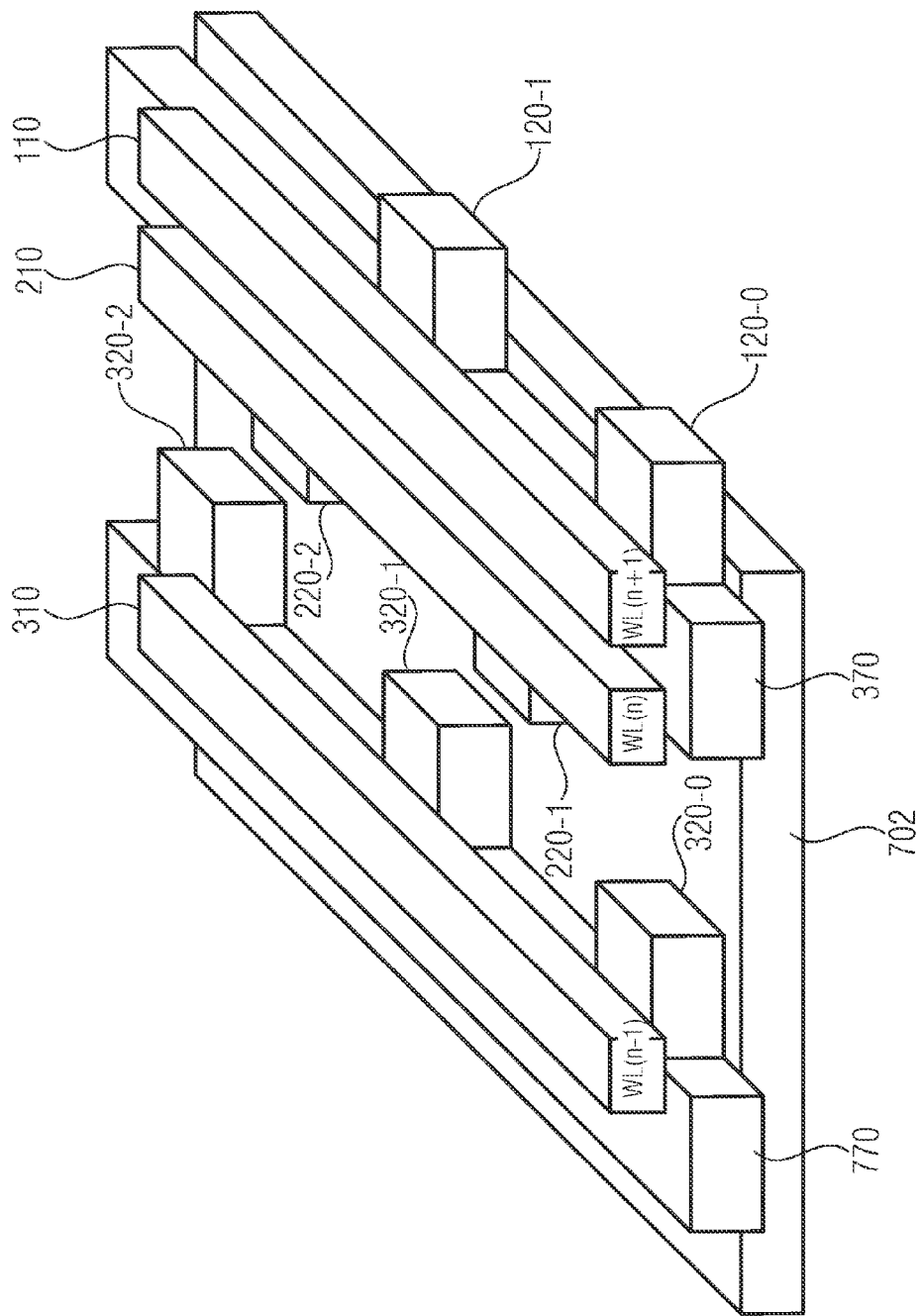

FIG. 8B shows the layout of the structure according to FIG. 8A additionally comprising three word lines 110, 210 and 310. The read lines 110 and 210 are arranged on the common channel structure 370 similar to the structure explained based on FIG. 7.

Figure 8C:
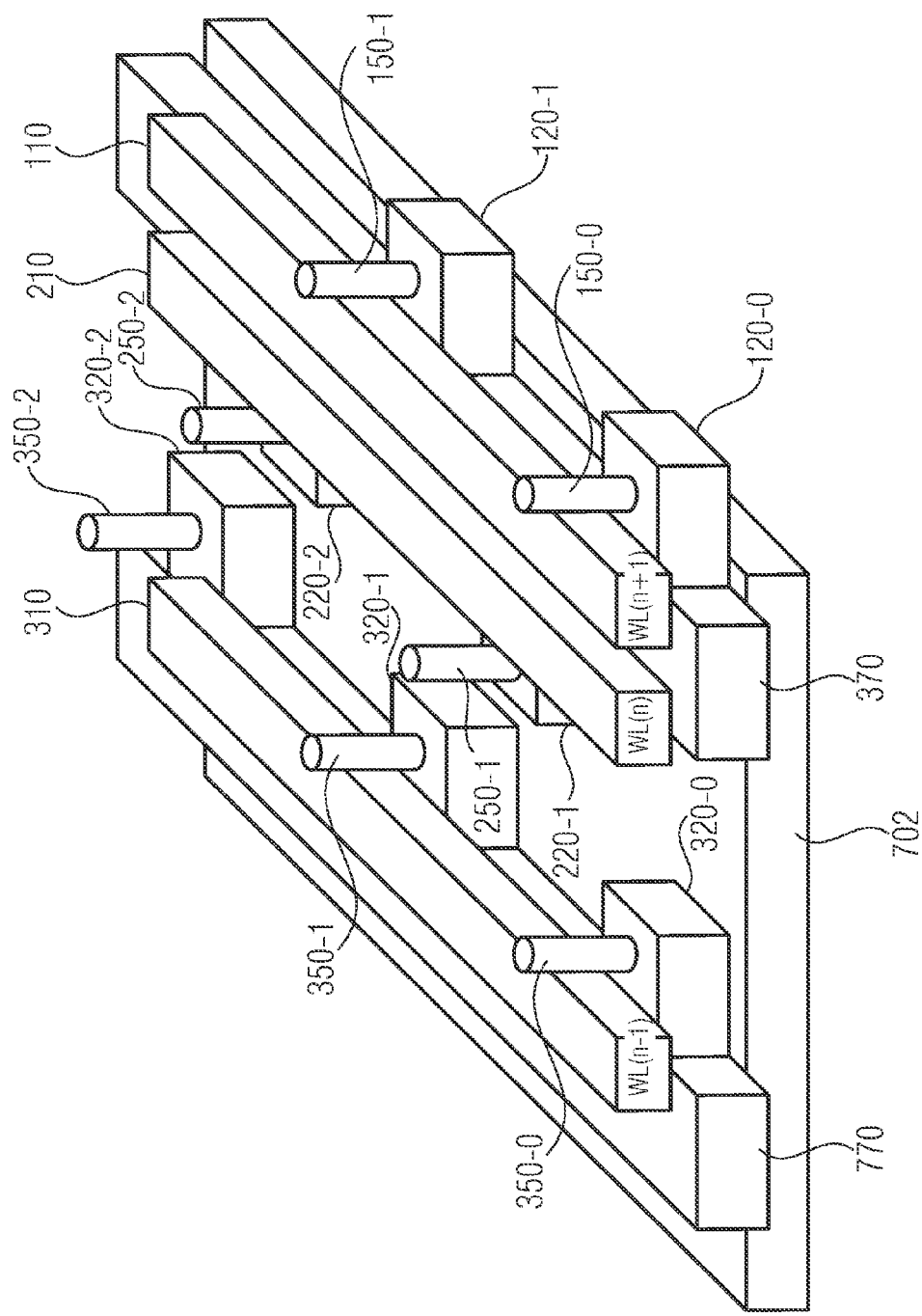

FIG. 8C shows the structure according to FIG. 8B after a consecutive manufacturing step, wherein the electrical connections have been created (programmed) or not according to the bit cell type to be produced at the respective location of the read-only memory.

Figure 8D:
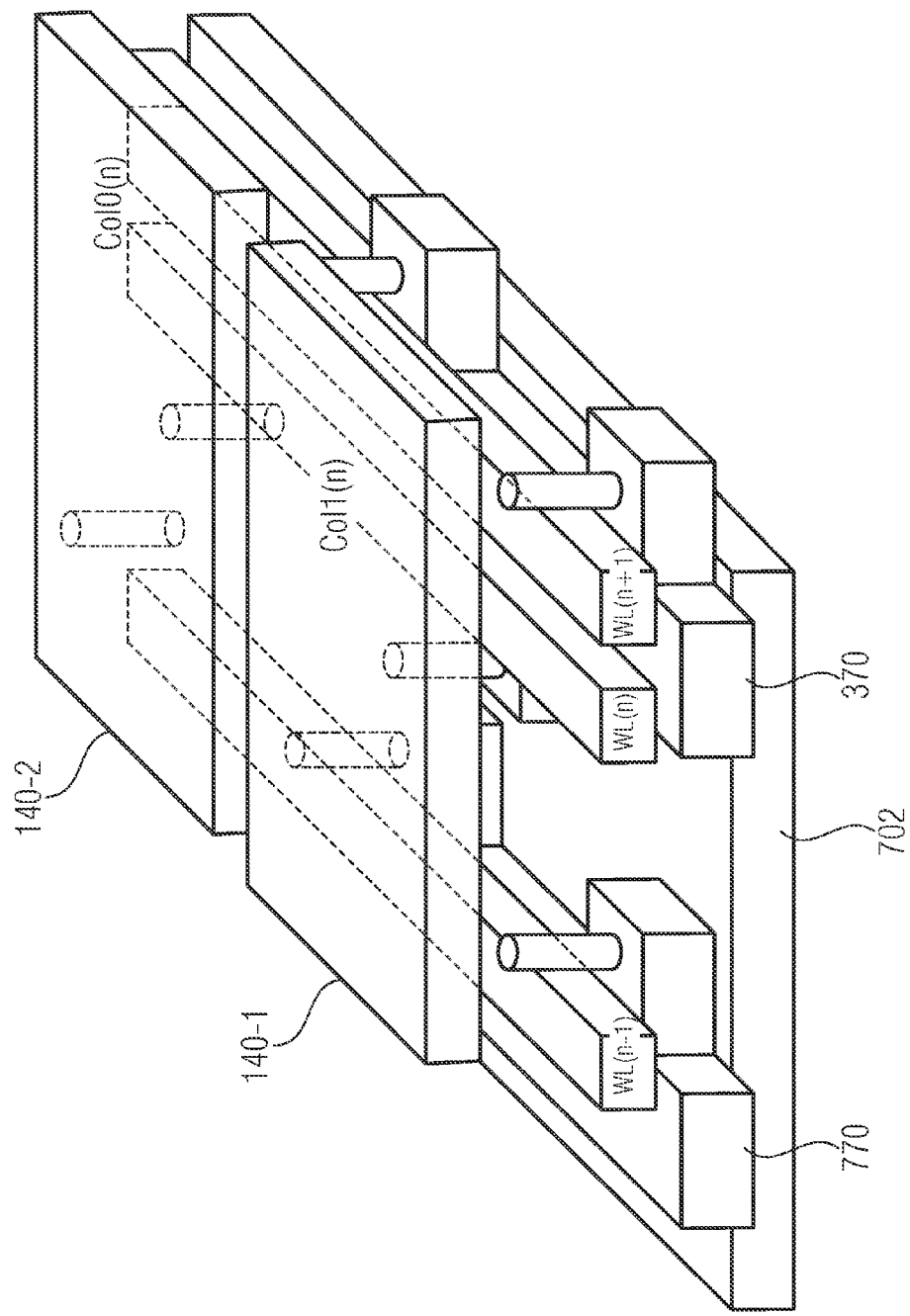

FIG. 8D shows the structure of FIG. 8C after a consecutive manufacturing step, wherein the bit lines 140-1 and 140-2 have been produced to connect the bit line with the bit cells they are associated with (connections only for the bit cells of the first bit cell-type). Due to the shift of the protrusions on the left-hand side with regard to the protrusions on the right-hand side, the bit lines 140-1 and 140-2 comprise a larger width than the bit lines as shown in FIG. 9C. However, the distance between the main bodies of the first and second common channel structures 370, 770 can be reduced compared to embodiments comprising protrusions which are not shifted, i.e. are arranged at the same height, as for example shown in FIG. 7.

Figure 9A:
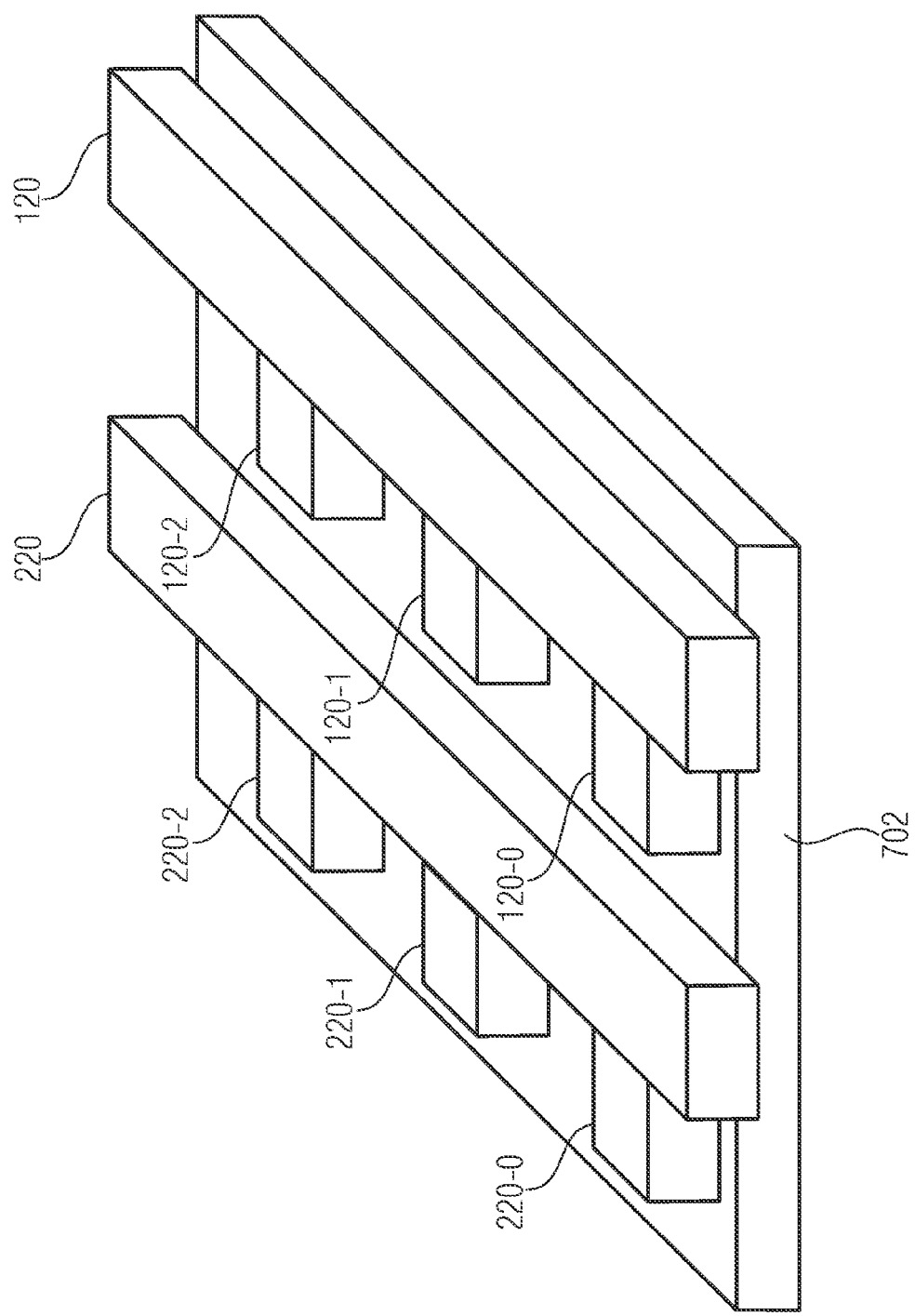
FIGS. 9A to 9C show intermediate and final structures for a manufacturing process of an embodiment of a read-only memory according to FIG. 1A.
Figure 9B:
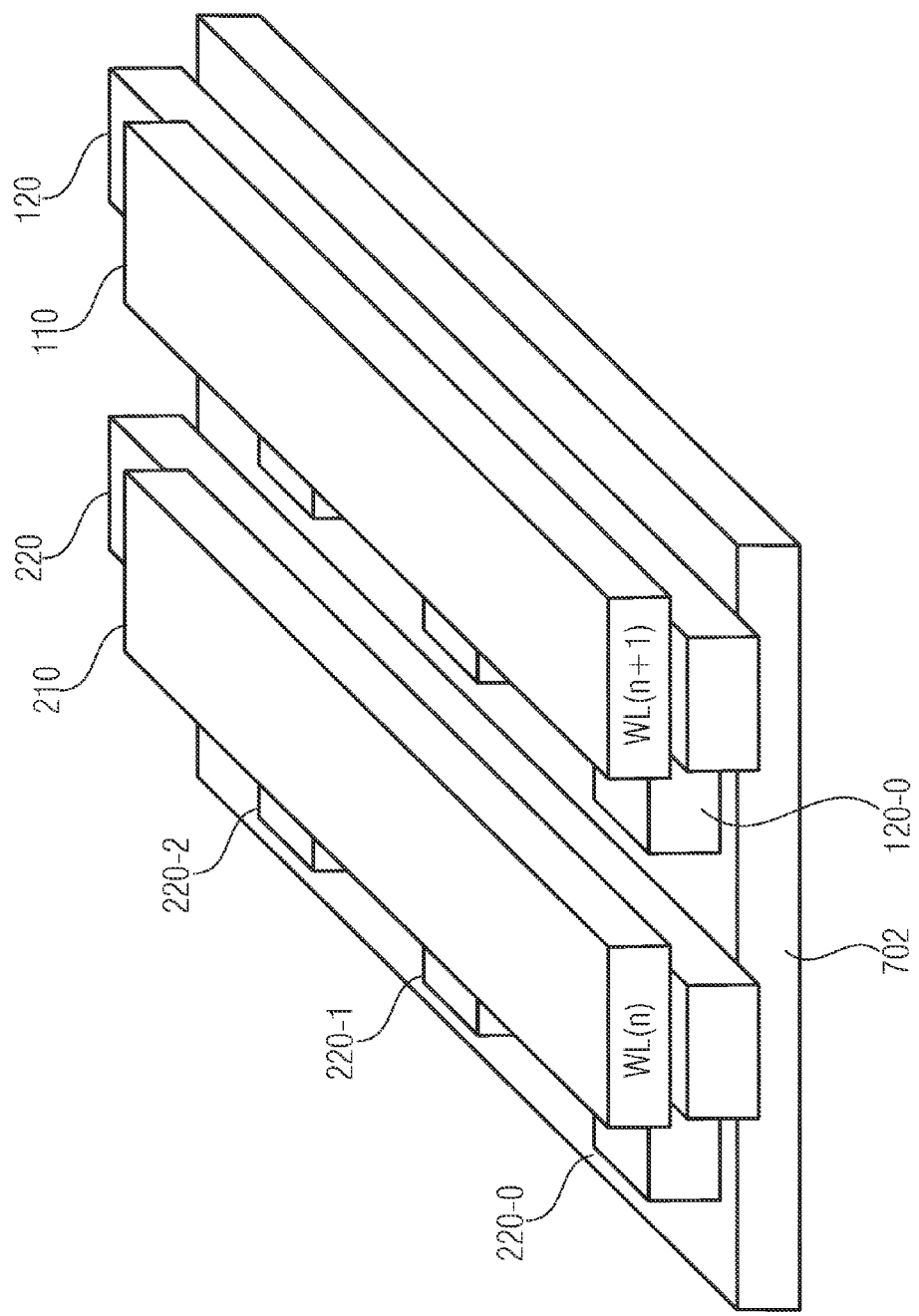
Figure 9C:
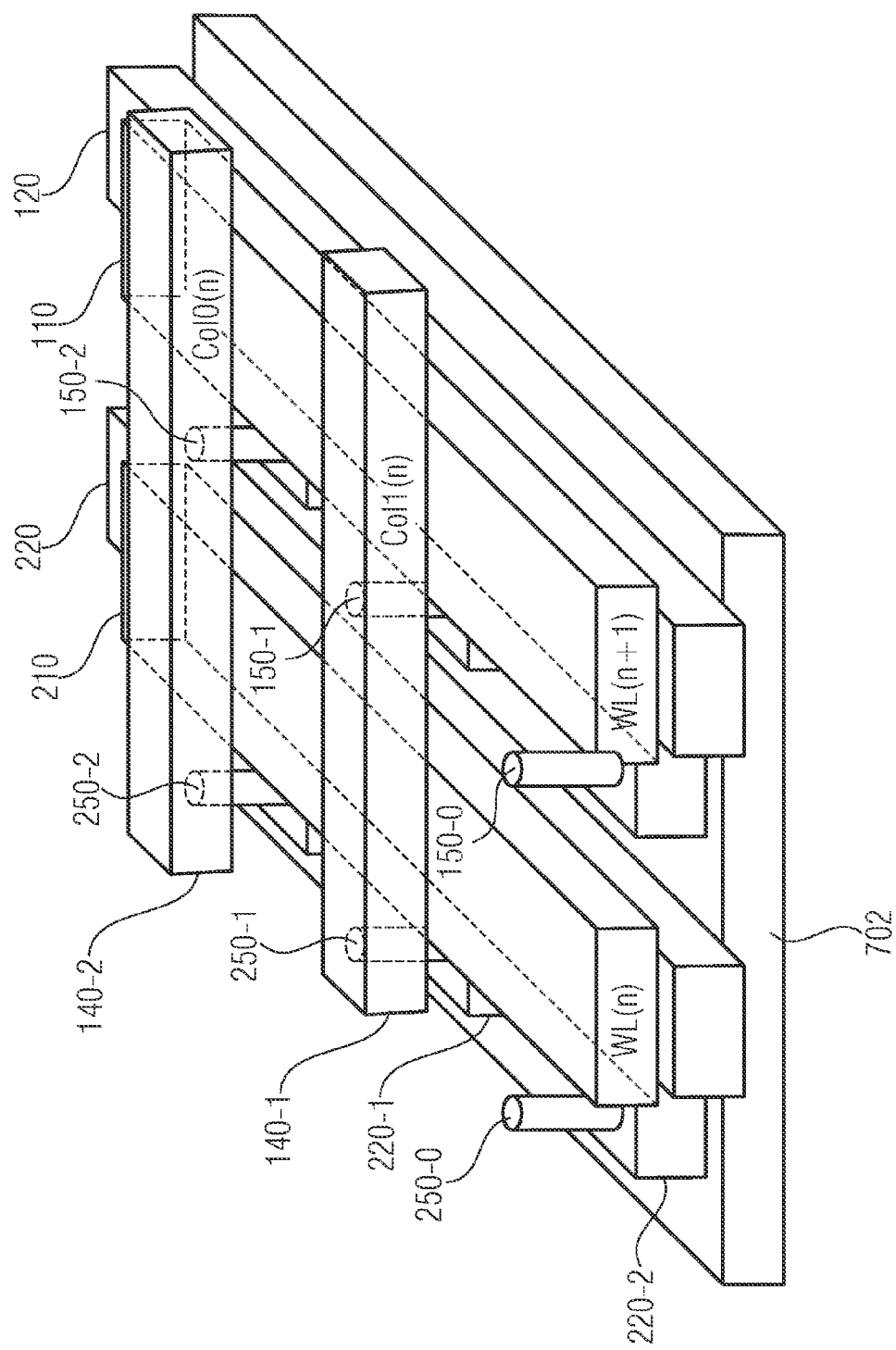

FIGS. 9A to 9C show the intermediate and final structure of the manufacturing process of a read-only memory similar to the one shown in FIG. 2A (only differing with regard to the electrical connections).

FIG. 9A shows a substrate 702 and a first channel structure 120 and a second channel structure 220, which are arranged on top of the substrate 702. The first channel structure 120 comprises a main body and on the left-hand side of the main body, protrusions 120-0, 120-1 and 120-2, which are arranged in an equidistant manner to each other on the left-hand side of the main body of the channel structure 120.

The second channel structure 220 comprises a main body and protrusions 220-0, 220-1, 220-2, which are arranged in an equidistant manner on the left-hand side of the main body of the channel structure 220. The main bodies of the first and second channel structures 120, 220 are arranged in parallel to each other and the protrusion 120-0 at the same height as the protrusion 220-0 of the second channel structure. The same is valid for the protrusions 120-1 with regard to protrusion 220-1 and for protrusion 120-2 with regard to protrusion 220-2. The main bodies of the first and second channel structure 120, 220 have the same dimensions. The protrusions 120-0, 120-1, 120-2, 220-0, 220-1 and 220-2 have the same dimensions.

FIG. 9B shows the structure of FIG. 9A after a consecutive manufacturing process step, wherein the wire line has been arranged on top and extends along the respective channel areas, i.e., the wire line 110 on top and along the first channel area 120 and the second wire line 210 on top and along the second channel area 220.

FIG. 9C shows the structure of FIG. 9B after a further manufacturing step, wherein the electrical connections 150 and the bit lines 140-1, 140-2 have been produced (bit line "140-0" is not shown in FIG. 9C).

Although FIGS. 8A to 8D and 9A to 9C show the manufacturing processes of embodiments of read-only memories where in the channel area or common channel structure are arranged on top of a substrate, the wire lines (gate lines) are arranged on top of the channel structures respectively channel areas, and wherein the bit lines (read lines) are arranged above the word lines (gate lines), other structures and other orders of the different production steps are possible to manufacture embodiments of the read-only memory as described within this application.

Embodiments of the invention provide a read-only memory architecture, wherein bit lines are connected with a terminal of a multi-terminal transistor. According to the bit information (0 or 1), a physical and electrical connection to the transistor is established or not. For embodiments comprising a NFET transistor as a multi-terminal transistor, in case an electrical connection to the terminal is established, the bit line has a direct connection to ground when the corresponding word line is activated (ACT). In case no connection is established to the terminal, a minimal driver makes sure that the opposite logic potential $V_{DD}$ is maintained on the bit line. The means for reading out the stored data, for example, a sense amplifier (SA) connected to the bit line assures a correct evaluation of the stored bit information. The driver is implemented to compensate the diode leakage and coupling effects. A simple (initialized) "bus holder" can be used to realize such a means for reading out the stored data. The multi-terminal transistor can be equated with a word line. At the beginning and at the end of a word line, a connection to ground is arranged at the multi-terminal transistor. Optionally, bit lines of, for example, even and odd addresses are fed in an alternating manner to the multi-terminal transistor. In case of an access on an even address, the odd addresses or bit lines are used as further ground connections. These additional ground connections can shorten the length of the path to both outer connections to ground arranged at the border of the "array".

In case of an activation of a word line, all bit lines, which are connected to the multi-terminal transistor, are short-circuited via the transistor channel and are, thus, connected also to ground.

In case it is not possible to secure that a certain read-only memory allocation never comprises more than a given number of omitted electrical connections in a row, "dummy" bit lines or fixed connection lines to ground can be implemented in the "array" (see FIG. 4A). In this way, it is possible to achieve a sufficient connection to ground (GND) even in embodiments comprising very large word lines.

Embodiments of the read-only memory comprise a so-called "multi-terminal transistor", for example, a multi-terminal NFET, also referred to as an "array" transistor. This "array" transistor does not comprise the known "gate", "source", "drain" and "bulk" terminals, but comprises a plurality of "source", respectively "drain" contacts. Therefore, the term "multi-terminal transistor". The formed transistor channel acts as a ground connection, which comprises a plurality of "ground" feeds and lead aways. Embodiments of the read-only memory and the multi-terminal transistor allow for a very compact and efficient "array" structure.

Further embodiments comprise a programmable read-only memory (PROM), wherein the electrical connection of a storage cell is programmable or an erasable and programmable read only memory (EPROM), wherein an electrical connection of a storage cell is erasable and programmable.

Figure 10A:
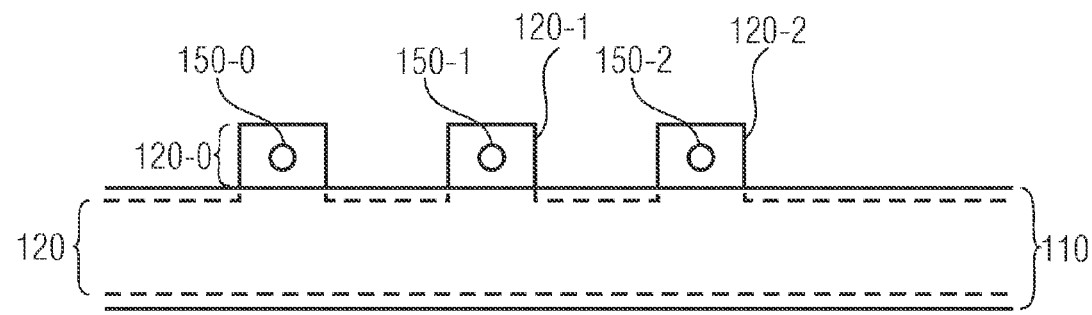
FIG. 10A shows a top-view of an embodiment of a switching structure.

FIG. 10A shows a top-view of an embodiment of a switching structure 1000 comprising a gate line 110 (see continuous lines), a channel area 120 (see dashed lines) wherein the channel area 120 comprises a rectangular main body arranged below the gate line 110 and further comprises protrusions 120-0, 120-1, 120-2. The switching structure 1000 further comprises terminals or electrical connections 150-0, 150-1, 150-2. The gate line 110 extends along the channel area 120 so that the channel area can be set into a conductive state by activating the gate line, for example, by applying an activate signal ACT. The terminal 150-0 is connectable to a predetermined voltage independent of the activation or deactivation of the channel area 120. The terminals 150-0, 150-1, 150-2 comprise an electrical connection to the channel area 120. The plurality of terminals 150-1, 150-2 is connectable to the predetermined voltage connected to the terminal 150-0 by activating the gate line 110.

Figure 10B:
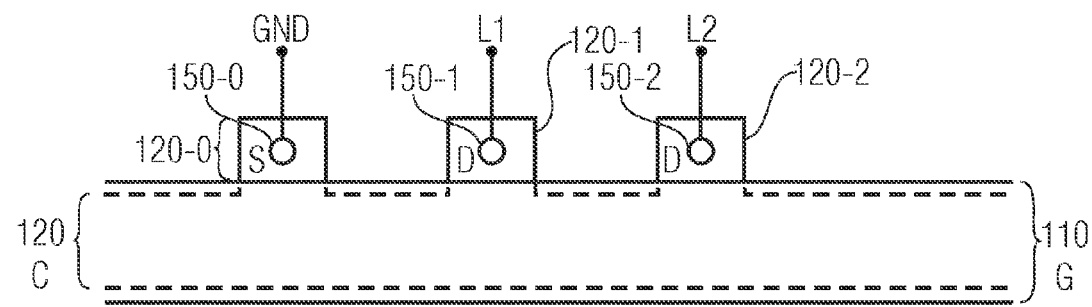
FIG. 10B shows a top-view of an embodiment of an n-channel switching structure, wherein a plurality of terminals can be connected to ground GND.

FIG. 10B shows an embodiment of the switching structure according to FIG. 10A, the switching structure 1000 comprising an n-type channel area 120, wherein the terminal 150-0 is connected to ground GND as the predetermined voltage, wherein the terminal 150-1 is connected to a first signal line L1, and wherein the second terminal 150-2 is connected to a second signal line L2. Activating the gate line and setting the channel area 120 into a conductive state connects the first signal line L1 and the second signal line L2 with the terminal 150-0, i.e., with ground GND, and pulls down the voltage levels at the signal lines L1, L2.

As explained previously, the gate 110 and the channel area 120 form one continuous gate structure and continuous channel structure, or in other words, one large transistor, which comprises three or more connections or terminals 150-0, 150-1 and 150-2. Therefore, this structure can also be referred to as a multi-terminal transistor 1000, and the embodiment shown in FIG. 10B with an n-type channel area also as a multi-n-channel transistor.

In an embodiment according to FIG. 10B, the terminal 150-0 connected to ground GND forms a common source-terminal S (see FIG. 10B), and the plurality of terminals 150-1, 150-2 connected to the first and second signal line L1, L2 form drain terminals D (see FIG. 10B). In alternative embodiments, terminal 150-0 can be connected to, for example, a supply voltage $V_{DD}$, thus forming a common drain terminal D, wherein the terminals 150-1, 150-2 connected to the first and second signal line L1, L2 form source terminals S. Thus, in a more general sense, the terminal 150-0 forms a terminal of a first terminal type, whereas the terminals 150-1, 150-2 form terminals of a second terminal type.

Further embodiments comprise p-channel transistors.

The embodiments of the switching structure may comprise a gate line 110 and a channel area 120, which are arranged such that they form any suitable field-effect transistor (FET) or FET-like structure, for example, a junction-FET (JFET) or a metal oxide semiconductor FET (MOSFET) structure.

The structure of embodiments of the switching structure according to FIGS. 10A and 10B can be implemented very similar to the structures already explained based on, for example, FIGS. 1A to 1C, wherein the read-lines of the read-only memory embodiments are replaced by signal lines. The explanations given based on FIGS. 1 to 9 about the read-only memories apply correspondingly to the switching structure according to FIG. 10A, FIG. 10B and FIG. 11, which will be explained in the following.

Figure 11:
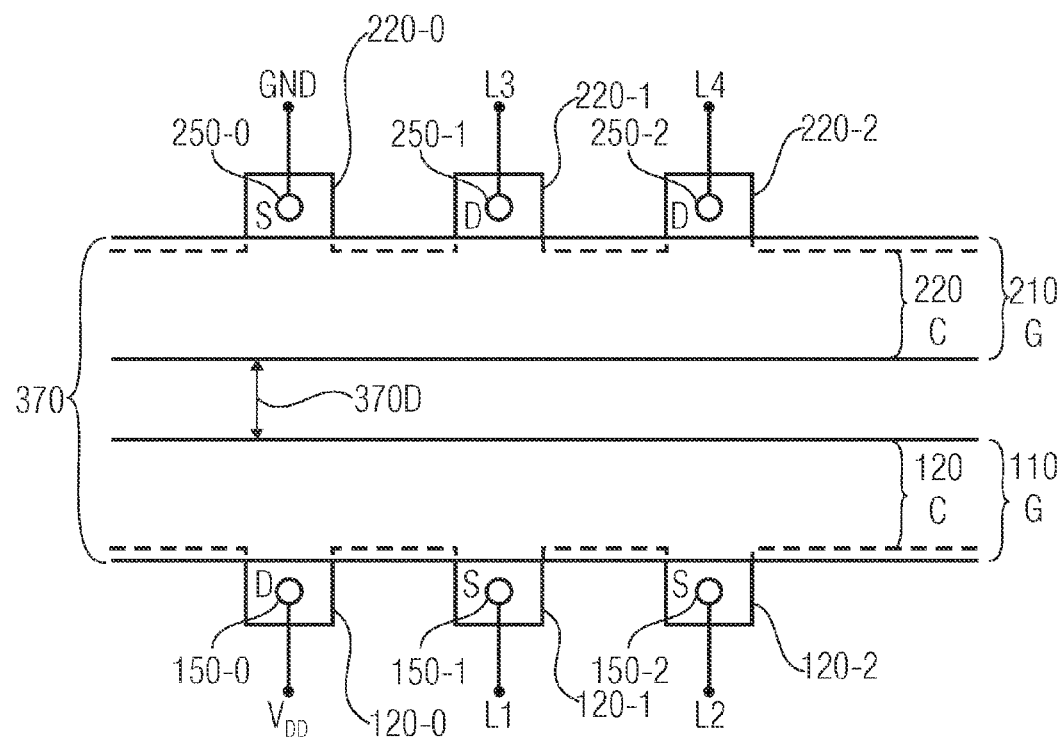
FIG. 11 shows a top-view of an embodiment of a switching structure, wherein two neighboring gate lines extend along a common channel structure.

FIG. 11 shows an embodiment of the switching structure 1100 comprising two gate lines 110, 210 and a common channel structure 370, which is similar to the embodiment of the read-only memory explained based on FIGS. 3A and 3B.

The embodiment of the switching structure 1100 comprises a common channel structure 370 and two gate lines 110, 210 extending along the common channel structure 370, wherein the first gate line 110 extends along the first channel area 120 comprised in the common channel structure 370, and wherein the second gate line 210 extends along the second channel area 220 also comprised in the common channel structure. The common channel structure 370 comprises a rectangular main body and protrusions 120-0, 120-1, 120-2 at the side of the first gate line 110 and respectively the first channel area 120, and further protrusions 220-0, 220-1, 220-2 arranged at the side of the second gate line 210 and respectively the second channel area 220. The terminals 150-0, 150-1, 150-2 are arranged at the first gate line 110 and electrically connected to the corresponding protrusions 120-0, 120-1, 120-2. The terminals 250-0, 250-1, 250-2 are arranged at the second gate line 210 and are connected to the corresponding protrusions 220-0, 220-1, 220-2.

FIG. 11 shows an embodiment of a switching-structure 1100, wherein the terminal 150-0 is connected to a first predetermined voltage, for example, $V_{DD}$, and wherein the terminal 250-0 is connected to a second predetermined voltage, for example, ground GND. The terminal 150-1 is connected to a first signal line L1, the terminal 150-2 is connected to a second signal line L2, the terminal 250-1 is connected to a third signal line L3 and the terminal 250-2 is connected to a fourth signal line L4. As explained based on FIGS. 10A and 10B, the first gate line 110, the first channel area 120 and the terminals 150-0, 150-1, 150-2 form a first multi-terminal transistor, wherein the gate line 110 forms a first common gate G (common to the terminals 150-0, 150-1, 150-2), wherein the channel area 120 forms a first common channel area C, wherein the terminal 150-0 forms a common drain terminal D, and wherein the plurality of terminals 150-0, 150-1, 150-2 form individual source terminals S. Correspondingly, the second gate line 210, the second channel area 220 and the terminals 250-0, 250-1, 250-2 form a second multi-terminal transistor, wherein the second gate line 210 forms a second common gate G (common to the terminals 250-0 to 250-2), the second channel area 220 forms a second common channel area C, the terminal 250-0 forms a common source terminal S and the terminals 250-1 and 250-2 form individual drain terminals D.

Activating the first gate 110 puts the first common channel area 120 in a conductive state and connects the first and second signal lines L1 and L2 with the first predetermined voltage, for example a supply voltage $V_{DD}$. Activating the second common gate 210 puts the second common channel area 220 in a conductive state and connects the third and fourth signal line L3, L4 to the second predetermined voltage, for example ground GND.

The embodiments according to FIG. 10A and FIG. 10B allow connection of a plurality of signal lines to a predetermined voltage using one large multi-terminal switching structure instead of using a plurality of individual transistors and allow a further reduction of the required surface area by eliminating the need for providing the respective "individual source terminals" (which would be necessary considering an implementation providing a similar functionality as the embodiments shown in FIG. 10B, where a plurality of signal lines will be connected/disconnected to ground GND by individual transistors each comprising an individual source and drain—instead of the one multi-terminal transistor of FIG. 10B) and also eliminating the need for a metallic connection for the individual "source terminals", which would be necessary for connecting the individual source terminals to ground GND.

Compared to embodiments according to FIGS. 10A and 10B, embodiments according to FIG. 11 allow to further reduce the required surface area for implementing a switchable connection of the plurality of signal lines to a predetermined voltage, because the distance 370 D between the two gate lines 110, 210 can be set to a minimum distance required for insulating the two gate lines, as previously described.

Although FIG. 11 shows an embodiment of a switching structure, wherein the terminal 150-0 is connected to a supply voltage $V_{DD}$ and the current 250-0 is connected to ground GND, in alternative embodiments, both terminals 150-0, 250-0 can be connected to the same voltage, for example, $V_{DD}$ or ground GND or to any other voltage level. In further embodiments, any of the terminals can be used as the terminal of a first terminal type, where the other terminals are terminals of a second terminal type.

In further embodiments, wherein the terminal 150-0 (see FIG. 10B) or 250-0 (see FIG. 11) is connected to ground, the signals on the signal lines L1, L2 (see FIG. 10B) or L3, L4 (see FIG. 11) have high voltage levels and/or are powered by current sources providing voltage levels or current levels, which are dimensioned such that when the gate line is activated, the voltage levels of the signal lines are reliably pulled down to a low voltage level L.

On the other hand, in further embodiments, wherein the terminal 150-0 (see FIG. 11) is connected to a supply voltage, the signals on the signal lines L1, L2 (see FIG. 11) have low voltage levels and/or are connected to current sinks, which are dimensioned such that when the gate line is activated, the voltage levels of the signal lines are reliably pulled up to the supply voltage, e.g. $V_{DD}$, or at least to a high voltage level H.

Depending on certain implementation requirements of the inventive methods, the inventive methods can be implemented in hardware or in software. The implementation can be performed using a digital storage medium, in particular, a disc, a CD or a DVD having an electronically-readable control signal stored thereon, which co-operates with a programmable computer system such that an embodiment of the inventive method is performed. Generally, an embodiment of the present invention is, therefore, a computer program produced with a program code stored on a machine-readable carrier, the program code being operative for performing the inventive method when the computer program product runs on a computer. In other words, embodiments of the inventive method are, therefore, a computer program having a program code for performing at least one of the inventive methods when the computer program runs on a computer.

The aforegoing was particularly shown and described with reference to particular embodiments thereof. It will be understood by those skilled in the art that various other changes in the form and details may be made without departing from the spirit and scope thereof. It is, therefore, to be understood that various changes may be made in adapting the different embodiments without departing from the broader concept disclosed herein and comprehended by the claims that follow.

What is claimed is:

1. A semiconductor device comprising:
a first channel oriented along a first direction, the first channel having a length along the first direction longer than a width along a perpendicular second direction;
a first gate line extending along the first channel in the first direction, the first gate line disposed over and overlapping with the first channel, wherein the first channel is configured to be set into a conductive state by activating the first gate line, wherein the first gate line has a length extending along the first channel in the first direction and a width along the perpendicular second direction so that the width of the first gate line is perpendicular to the length of the first gate line, and wherein the length of the first gate line is longer than the width of the first gate line, wherein the first gate line having the length along the first direction and the width along the second direction is directly above the first channel and overlaps with the first channel; and
three first terminals separate from each other and electrically connected to the first channel at a first location, a second location, and a third location, wherein the first, the second, and the third locations are different locations of a continuous region of the first channel and are arranged along a line in the first direction, wherein the three first terminals are electrically coupled together by activating the first gate line,
wherein the three first terminals include at least one source terminal and at least one drain terminal and wherein the semiconductor device forms a single transistor.

2. The semiconductor device of claim 1, wherein the semiconductor device is a switching structure.

3. The semiconductor device of claim 1, wherein the three first terminals are disposed along a same side of the first channel.

4. The semiconductor device of claim 1, further comprising:
a second channel oriented along the first direction, the second channel separated from the first channel;
a second gate line extending along the second channel in the first direction, the second gate line disposed over the second channel so that the second channel is configured to be set into a conductive state by activating the second gate line; and
three second terminals electrically coupled to the second channel, the three second terminals being electrically coupled together by activating the second gate line.

5. The semiconductor device of claim 4, wherein the second gate line is parallel to the first gate line.

6. The semiconductor device of claim 4, wherein the three first terminals are disposed along a same side of the first channel, and wherein the three second terminals are disposed along a same side of the second channel.

7. The semiconductor device of claim 4, wherein the three first terminals and the three second terminals are in opposite sides of the first channel.

8. The semiconductor device of claim 1, wherein a second line in the first direction connects the three first terminals, wherein the second line is parallel to the length of the first gate line and the line in the first direction, wherein the second line does not overlap the first gate line.

9. The semiconductor device of claim 8, further comprising a region on the second line, the region disposed between the at least one source terminal and the at least one drain terminal, wherein the region is not part of a current path between the at least one source terminal and the at least one drain terminal during the ON state of the single transistor.

10. A semiconductor device comprising:
a first channel having a first doping type disposed in a substrate, the first channel having a first length along a first direction and a second length along a second direction perpendicular to the first direction, the first length being longer than the second length;
a first gate line oriented along the first direction, the first gate line disposed over and overlapping with the first channel, wherein the first gate line has a length extending along the first channel in the first direction and a width along the second direction so that the width of the first gate line is perpendicular to the length of the first gate line, and wherein the length of the first gate line is longer than the width of the first gate line, wherein the first gate line having the length along the first direction and the width along the second direction is directly above the first channel and overlaps with the first channel;
a first source/drain terminal electrically connected through a first location in the first channel, the first source/drain terminal laterally protruding out relative to the first gate line;
a second source/drain terminal electrically connected through a second location in the first channel, the second source/drain terminal laterally protruding out relative to the first gate line; and
a third source/drain terminal electrically connected through a third location in the first channel, the third source/drain terminal laterally protruding out relative to the first gate line, wherein the first, the second, and the third locations are different locations of a continuous region of the first channel, the continuous region having the first doping type, wherein the first, the second, and the third source/drain terminals are separate from each other and arranged along a line in the first direction,
wherein the first to third source/drain terminals include at least one source terminal and at least one drain terminal and wherein the semiconductor device forms a single transistor.

11. The semiconductor device of claim 10, wherein the first source/drain terminal, the second source/drain terminal, and the third source/drain terminal are disposed along a line.

12. The semiconductor device of claim 10, wherein the first gate line continuously extends at least from the first location to the third location.

13. The semiconductor device of claim 10, wherein the first source/drain terminal is coupled to a first potential node, and wherein the second source/drain terminal and the third source/drain terminal are coupled to a second potential node different from the first potential node.

14. The semiconductor device of claim 10, further comprising:
a second channel disposed in the substrate;
a second gate line oriented along the first direction, the second gate line disposed over the second channel;
a fourth source/drain terminal disposed at a fourth location in the second channel, the fourth source/drain terminal laterally protruding out relative to the second gate line, the fourth source/drain terminal electrically coupled to the second channel;

a fifth source/drain terminal disposed at a fifth location in the second channel, the fifth source/drain terminal laterally protruding out relative to the second gate line, the fifth source/drain terminal electrically coupled to the second channel; and a sixth source/drain terminal disposed at a sixth location in the second channel, the sixth source/drain terminal laterally protruding out relative to the second gate line, the sixth source/drain terminal electrically coupled to the second channel.

15. The semiconductor device of claim 14, wherein the first gate line and the second gate line are disposed between the first source/drain terminal and the fourth source/drain terminal.

16. The semiconductor device of claim 14, wherein the first, the second, and the third source/drain terminals are disposed along one side of the first gate line, and wherein the fourth, the fifth, and the sixth source/drain terminals are disposed along an opposite side of the first gate line.

17. The semiconductor device of claim 10, wherein the line in the first direction connecting the first, the second, and the third source/drain terminals is parallel to the first gate line without overlapping the first gate line.

18. A transistor comprising:
a channel region disposed in a semiconductor substrate and oriented along a first direction, the channel region having a length along the first direction longer than a width along a perpendicular second direction;

a gate line extending along the channel region in the first direction, the gate line disposed directly over the channel region and overlapping with the channel region;

a source region disposed in the semiconductor substrate and electrically and physically connected to the channel region at a first location;

a drain region disposed in the semiconductor substrate and electrically and physically connected to the channel region at a second location; and a source/drain region disposed in the semiconductor substrate and electrically and physically connected to the channel region at a third location, wherein the first, the second, and the third locations are different locations of a continuous region of the channel region and are arranged along a line in the first direction, wherein a second line in the first direction connects the source region, the drain region, and the source/drain region, wherein the second line is parallel to the gate line, wherein the second line does not overlap the gate line, wherein the continuous region of the channel region has a first doping type, and wherein the source region, the drain region, and the source/drain region have a second doping type opposite to the first doping type, and wherein the transistor is a single transistor.

19. The transistor of claim 18, wherein the gate line has a length extending along the channel region in the first direction and a width along the second direction so that the width of the gate line is perpendicular to the length of the gate line, and wherein the length of the gate line is longer than the width of the gate line.

* * * * *